United States Patent
Moghaddam et al.

(10) Patent No.: US 10,897,833 B2
(45) Date of Patent: *Jan. 19, 2021

(54) HIERARCHICAL HYDROPHILIC/HYDROPHOBIC MICRO/NANOSTRUCTURES FOR PUSHING THE LIMITS OF CRITICAL HEAT FLUX

(71) Applicant: University of Florida Research Foundation, Incorporated, Gainesville, FL (US)

(72) Inventors: Saeed Moghaddam, Gainesville, FL (US); Seyyed A. Fazeli, Gainesville, FL (US)

(73) Assignee: UNIVERSITY OF FLORIDA RESEARCH FOUNDATION, INCORPORATED, Gainesville, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 16/598,176

(22) Filed: Oct. 10, 2019

(65) Prior Publication Data

US 2020/0128695 A1    Apr. 23, 2020

Related U.S. Application Data

(63) Continuation of application No. 15/185,766, filed on Jun. 17, 2016, now Pat. No. 10,492,333, which is a
(Continued)

(51) Int. Cl.
*H05K 7/20* (2006.01)
*F28F 3/02* (2006.01)
(Continued)

(52) U.S. Cl.
CPC ....... *H05K 7/20309* (2013.01); *F28D 15/025* (2013.01); *F28D 15/046* (2013.01);
(Continued)

(58) Field of Classification Search
CPC ............. H01L 23/3675; H01L 23/427; H05K 7/20309; H05K 7/20318; H05K 7/20327;
(Continued)

(56) References Cited

U.S. PATENT DOCUMENTS 6,903,929 B2   6/2005 Prasher et al.
7,115,987 B2  10/2006 Holalkere et al.
(Continued)

OTHER PUBLICATIONS

Chen, T. et al., "Measurements and high-speed visualizations of flow boiling of a dielectric fluid in a silicon microchannel heat sink," International Journal of Multiphase Flow, 2006, pp. 957-971, vol. 32.
(Continued)

*Primary Examiner* — Jacob R Crum
(74) *Attorney, Agent, or Firm* — Alston & Bird LLP

(57) ABSTRACT

A high efficiency heat sink for the cooling of microelectronic devices involves a phase change from liquid fluid to fluid vapor with a vapor quality of 100%. The liquid fluid is provided to an active area that contains fins having micrometer dimension that support a membrane that is nanoporous. The membrane is effectively impermeable to liquid fluid but permeable to fluid vapor. The heat sink provides very high heat flux and coefficient of heat transfer at low mass flux over a broad range of surface superheat temperatures. The heat sink can be constructed of equi-spaced posts that separate liquid microchannels from vapor microchannels that are connected through capillary forced valves formed between adjacent equi-spaced posts.

20 Claims, 28 Drawing Sheets

Related U.S. Application Data continuation-in-part of application No. PCT/US2014/070903, filed on Dec. 17, 2014.

(60) Provisional application No. 61/917,177, filed on Dec. 17, 2013.

(51) Int. Cl.

| F28F 13/18 | (2006.01) |
|---|---|
| F28D 15/04 | (2006.01) |
| H01L 23/427 | (2006.01) |
| F28D 15/02 | (2006.01) |
| H01L 23/367 | (2006.01) |

(52) U.S. Cl.
CPC .............. *F28F 3/02* (2013.01); *F28F 13/187* (2013.01); *H01L 23/3675* (2013.01); *H01L 23/427* (2013.01); *H05K 7/20318* (2013.01); *H05K 7/20327* (2013.01); *F28F 2245/04* (2013.01); *F28F 2255/20* (2013.01); *H01L 2924/0002* (2013.01)

(58) Field of Classification Search
CPC ........ F28D 15/025; F28D 15/046; F28F 3/02; F28F 13/187; F28F 2245/04; F28F 2255/20
See application file for complete search history.

(56) References Cited

U.S. PATENT DOCUMENTS

| 7,265,979 | B2 | 9/2007 | Erturk et al. | |
|---|---|---|---|---|
| 7,523,780 | B2 | 4/2009 | Dickey et al. | |
| 7,633,752 | B2 | 12/2009 | Fresher | |
| 2004/0008487 | A1* | 1/2004 | Hisano | H05K 7/20254 361/690 |
| 2004/0093887 | A1* | 5/2004 | Shyy | F04B 43/043 62/259.2 |
| 2004/0104012 | A1 | 6/2004 | Zhou et al. | |
| 2008/0229580 | A1 | 9/2008 | Anderson et al. | |
| 2010/0328888 | A1* | 12/2010 | Campbell | H01L 23/4735 361/699 |
| 2011/0120674 | A1 | 5/2011 | MacDonald et al. | |
| 2013/0027884 | A1 | 1/2013 | Campbell et al. | |
| 2013/0105122 | A1 | 5/2013 | Campbell et al. | |
| 2014/0318167 | A1 | 10/2014 | Uchida | |
| 2014/0338778 | A1 | 11/2014 | Li et al. | |
| 2016/0161193 | A1 | 6/2016 | Lewis et al. | |
| 2016/0227672 | A1 | 8/2016 | Lin | |

OTHER PUBLICATIONS

David, Milnes P., et al., "Hydraulic and thermal characteristics of a vapor venting two-phase microchannel heat exchanger", International Journal of Heat and Mass Transfer, Aug. 18, 2011, vol. 54, pp. 5504-5516, Elsevier Ltd., Netherlands.

Fazeli, Abdolreza, et al., "A New Paradigm for Understanding and Enhancing the Critical Heat Flux (CHF) Limit", Scientific Reports, Jul. 12, 2017, 12 pages, www.Nature.com.

International Searching Authority, International Search Report and Written Opinion for International Application No. PCT/US2014/070903, dated Mar. 20, 2015, 7 pages, USPTO, USA.

Kalani, A. et al., "Experimental Investigation of Flow Boiling Performance of Open Microchannels with Uniform and Tapered Manifolds (OMM)," Proceedings of the ASME Summer Heat Transfer Conference, Jul. 14-19, 2013, Minneapolis, Minnesota USA, pp. 1-9.

Kalani, A. et al., Pool Boiling of FC-87 Over Microchannel Surfaces At Atmospheric Pressure, Proceedings of the ASME 2012 Ie international Mechanical Engineering Congress & Exposition, Nov. 9-15, 2012, Houston, Texas USA, pp. 1-7.

Kalani, A. et al., "Preliminary Results of Pressure Drop Modeling During Flow Boiling in Open Microchannels with Uniform and Tapered Manifolds (OMM)," Proceedings of the ASME 2013 International Mechanical Engineering Congress & Exposition, Nov. 13-21, 2013, San Diego, California USA, pp. 1-7.

Kosar, A. et al., "Suppression of Boiling Flow Oscillations in Parallel Microchannels by Inlet Restrictors," Journal of Heat Transfer, Mar. 2006, pp. 251-260, vol. 128.

Kuo, C-J. et al., "Bubble Dynamics During Boiling in Enhanced Surface Microchannels," Journal of Microelectromechanical Systems, Dec. 2006, pp. 1514-1527, vol. 15, No. 6.

Kuo, C-J. et al., "Local measurement of flow boiling in structured surface microchannels, International Journal of Heat and Mass Transfer," 2007, pp. 4513-4526, vol. 50.

Lee, J. et al., "Implementation of Microchannel Evaporator of High-Heat-Flux Refrigeration Cooling Applications," Transactions of the ASME, Journal of Electronic Packaging, Mar. 2006, pp. 30-37, vol. 128.

Li, D. et al., "Enhancing Flow Boiling [-Feat Transfer in Microchannels for Thermal Management with Monolithically-Integrated Silicon Nanowires," Nano Letters, 2012, pp. 3385-3390, vol. 12.

Li, D. et al., "Enhancing Flow Boiling Heat Transfer in Microchannels for Thermal Management with Monolithically-Integrated Silicon Nanowires," Nano Letters, 2012, pp. 3385-3390, vol. 12.

Liu, D. et al., "Flow Boiling Heat Transfer in Microchannels," Journal of Heat Transfer, Oct. 2007, pp. 1321-1332, vol. 129.

Morshed, A.K.M.M. et al., "Enhanced flow boiling in a microchannel with integration of nanowires," Applied Thermal Engineering, 2012, pp. 68-75, vol. 32.

Qu, W. et al., Flow Boiling heat transfer in two-phase micro-channel heat sinks-Experimental investigation and assessment of correlation methods, International Journal of Heat and Mass Transfer, 2003, pp. 2755-2771, vol. 46.

Steinke, M.E., et al., "An Experimental Investigation o f Flow Boiling Characteristics of Water in Parallel Microchannels," Journal of Heat Transfer, Aug. 2004, pp. 518-526, vol. 126.

Wang, G. et al., "Effects of inlet/outlet configurations on flow boiling instability in parallel microchannels," International Journal of Heat and Mass Transfer, 2008, pp. 2267-2281, vol. 51.

\* cited by examiner

HIERARCHICAL HYDROPHILIC/HYDROPHOBIC MICRO/NANOSTRUCTURES FOR PUSHING THE LIMITS OF CRITICAL HEAT FLUX

CROSS-REFERENCE TO RELATED APPLICATIONS

This application is a continuation of U.S. patent application Ser. No. 15/185,766, filed Jun. 17, 2016, titled "Hierarchical Hydrophilic/Hydrophobic Micro/Nanostructures for Pushing the Limits of Critical Heat Flux," which is a continuation-in-part of International Application No. PCT/US2014/070903, filed Dec. 17, 2014, which claims priority to U.S. Provisional Application Ser. No. 61/917,177, filed Dec. 17, 2013, the disclosures of which are hereby incorporated by reference herein in their entireties, including any figures, tables, or drawings.

BACKGROUND OF INVENTION

The primary mode of heat transfer for several decades has been single-phase cooling due to its low cost and reliability. Very high heat flux dissipation has become critical for miniaturized electronics with increased chip power densities. The use of microchannels for single-phase cooling has been pursued but is limited by the high chip temperature and large pumping power required. The traditional single-phase heat sinks are no longer capable of dissipating the generated heat in such applications. As a result, introduction of innovative thermal management methods is desired to address the demands of future electronic devices. Phase change heat sinks where boiling of a solvent is carried out has the ability to dissipate large quantities of heat. Phase change heat transfer that utilizes latent heat of vaporization is considered to be a solution for removing high heat flux from electronic devices. Research of flow boiling in microchannels has focused on the heat transfer and pressure drop performance of flow boiling in microchannels.

Flow instability, low heat transfer coefficient, and flow misdistribution have resulted in poor performance of two-phase systems. Various techniques have been pursued to avoid high pressure drops or pressure fluctuations. These techniques include artificial nucleation sites, inlet restrictors, and different inlet/outlet configurations. Over the past decades, extensive research efforts have been focused on enhancing boiling heat transfer and mitigating its issues. Most of these studies involve modification of the heated surface to enhance surface roughness, effective heat transfer area, or active nucleation sites. More recently, wick structures are also employed in microchannels to promote liquid delivery to the heated area and avoid dry-outs. Various geometries have been pursued, including: parallel trapezoidal cross section microchannels; parallel diverging microchannel with artificial nucleation sites; and parallel triangular microchannels. Generally, it is held that the use of inlet restrictors, an increase in system pressure, an increase in channel cross-section, a reduction in the number of channels, and a reduction in channel length allow a more stable flow in microchannels. Additional effects have been pursued by the use of: expanding microchannels for lower pressure drop and wall temperature fluctuation; cross-linked microchannels; square parallel microchannels; and microchannel heat sink with structured reentrant cavities. Open microchannels with tapered manifold configuration have been shown to simultaneously increase the heat transfer coefficient and the critical heat flux (CHF), which is the thermal limit of phase change during heating where there is a sudden decrease in the efficiency of heat transfer and overheating of the heating surface. In this manner, relatively high cooling rates without reaching CHF has been observed. However, high cooling rates have only been achieved with high surface superheating, high mass flux, low heat transfer coefficients, and/or low vapor exit quality. Although improvements in the heat transfer characteristics of boiling at microscale have been reported, the nature of the boiling process is not altered and, hence, the problems associated with boiling could not be eliminated.

The dynamics of heat transfer during nucleation process involves three different sub-mechanisms where, during bubble nucleation, micro-layer evaporation is the most effective mode of heat transfer and can dissipate heat fluxes up to 3 times greater than other sub-mechanisms. Flow boiling heat transfer in microchannels displays heat transfer rates with the thin film evaporation that is greater than the average convective boiling processes. However, thin film/micro-layer evaporative modes of heat transfer occur only for a very short period of time (<5 ms) and over small areas; thus the overall boiling heat transfer rate is lower than these modes. Dynamic and static instability issues associated with boiling at microscale and identified random nucleation, sudden growth of bubbles and moving evaporating thin film liquid is the cause of these instabilities and whenever liquid-vapor interfaces are rapidly disrupted, flow instability issues are intensified.

Hence there remains a need to have a heat sink for miniaturized electronics with high chip power densities that display high cooling rates, high heat transfer coefficients, low surface superheat temperatures, high vapor exit quality, and superior coefficients of performance (COP).

BRIEF SUMMARY

Embodiments of the invention are directed to heat sinks that have a liquid fluid entrance but a vapor fluid exit, where the vapor quality is 100%. The heat sink can employ a nanofiber membrane through which vapor readily passes but liquid is constrained by the nanoporous membrane. The device employs trenches that supply liquid refrigerant to an active area where fins support the membrane from which refrigerant exits as a vapor to a condenser. The rate of liquid introduction is readily balanced with the vapor exit to be of service over an extremely wide range of heat loads. The device employs a new two-phase cooling approach that is based on phase change over a predefined meniscus. The heat sink utilizes micro-engineered-structures to form a capillary-controlled meniscus separating liquid and vapor fields at specific locations. This configuration maintains stable liquid-vapor interface over a large area to employ thin film evaporation mode of heat transfer while alleviating flow instabilities.

Embodiments of the invention are directed to two-phase heat sinks that utilize thin film evaporation over a predefined liquid-vapor interface as the main mode of heat transfer. In one embodiment, liquid and vapor microchannels are separated with arrays of equi-spaced posts, which act as capillary forced valves and limit mixing of liquid and vapor phases. The location and shape of the meniscus can be altered by the device geometry, surface characteristics, and liquid pressure at the interface. In this manner, instability issues associated with randomly-moving evaporative interface in boiling can be significantly reduced.

BRIEF DESCRIPTION OF DRAWINGS

FIG. 2 shows a plot of heat flux as a function of superheat temperature for a heat sink, according to an embodiment of the invention, relative to that reported for other heat sinks designed for microelectronic devices, where comparative values for heat sinks that are plotted in FIGS. 2-5 are from:

Chen T, Garimella S V. (2006) Measurements and high-speed visualizations of flow boiling of a dielectric fluid in a silicon microchannel heat sink. *Int J Multiph Flow* 32:957-971.

Kalani A, Kandlikar S (2013) Experimental Investigation of Flow Boiling Performance of Open Microchannels with Uniform and Tapered Manifolds (OMM). *ASME 2013 Summer Heat Transf. Conf. Minneapolis*, pp 1-9.

Koşar A, Kuo C-J, Peles Y (2006) Suppression of Boiling Flow Oscillations in Parallel Microchannels by Inlet Restrictors. *J Heat Transfer* 128:251.

Kuo C, Kosar A, Peles Y (2006) Bubble dynamics during boiling in enhanced surface microchannels. *Microelectromechanical Syst J* 15:1514-1527.

Kuo C-J, Peles Y (2007) Local measurement of flow boiling in structured surface microchannels. *Int J Heat Mass Transf* 50:4513-4526.

Li D, Wu G S, Wang W, et al. (2012) Enhancing flow boiling heat transfer in microchannels for thermal management with monolithically-integrated silicon nanowires. *Nano Lett* 12:3385-90.

Liu D, Garimella S V. (2007) Flow Boiling Heat Transfer in Microchannels. *J Heat Transfer* 129:1321.

Morshed a. K M M, Yang F, Yakut Ali M, et al. (2012) Enhanced flow boiling in a microchannel with integration of nanowires. *Appl Therm Eng* 32:68-75.

Qu W, Mudawar I (2003) Flow boiling heat transfer in two-phase micro-channel heat sinks—I. Experimental investigation and assessment of correlation methods. *Int J Heat Mass Transf* 46:2755-2771.

Steinke M E, Kandlikar S G (2004) An Experimental Investigation of Flow Boiling Characteristics of Water in Parallel Microchannels. *J Heat Transfer* 126:518.

Wang G, Cheng P, Bergles a. E (2008) Effects of inlet/outlet configurations on flow boiling instability in parallel microchannels. *Int J Heat Mass Transf* 51:2267-2281.

Figure 3:
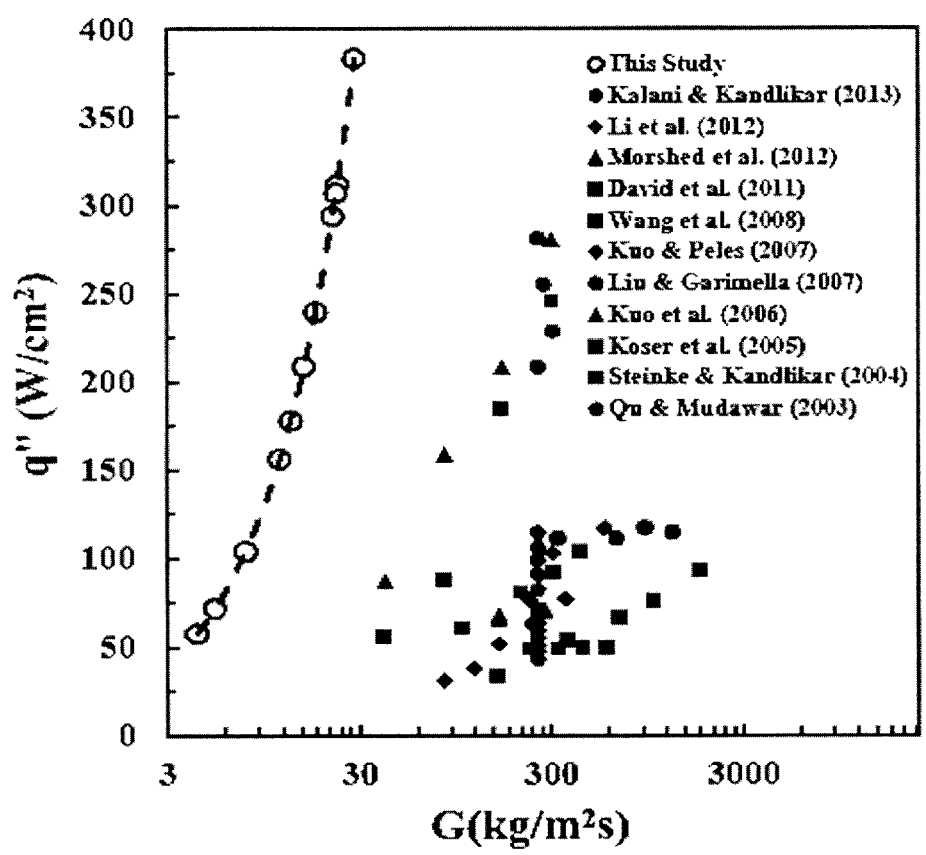

FIG. 3 shows a plot of heat flux as a function of mass flux for a heat sink, according to an embodiment of the invention, relative to that reported for other heat sinks designed for microelectronic devices.

Figure 4:
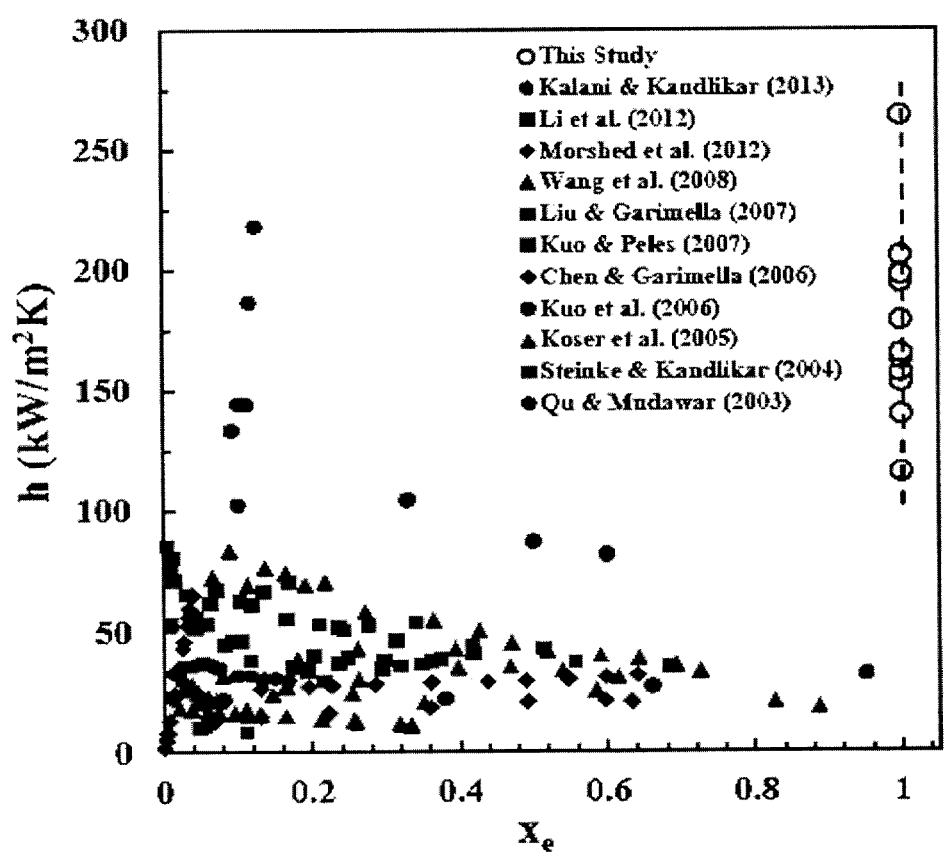

FIG. 4 shows a plot of heat transfer coefficient as a function of exit vapor quality for a heat sink, according to an embodiment of the invention, relative to that reported for other heat sinks designed for microelectronic devices.

Figure 5:
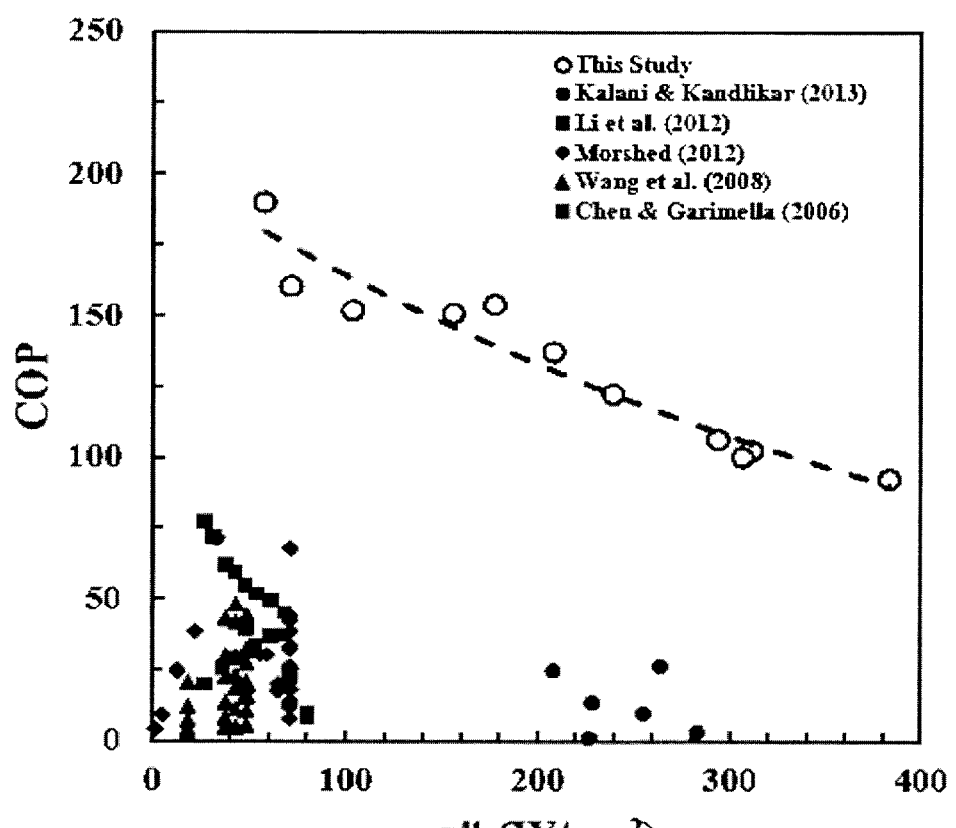

FIG. 5 shows a plot of the coefficient of performance as a function of heat flux for a heat sink, according to an embodiment of the invention, relative to that reported for other heat sinks designed for microelectronic devices.

Figure 6:
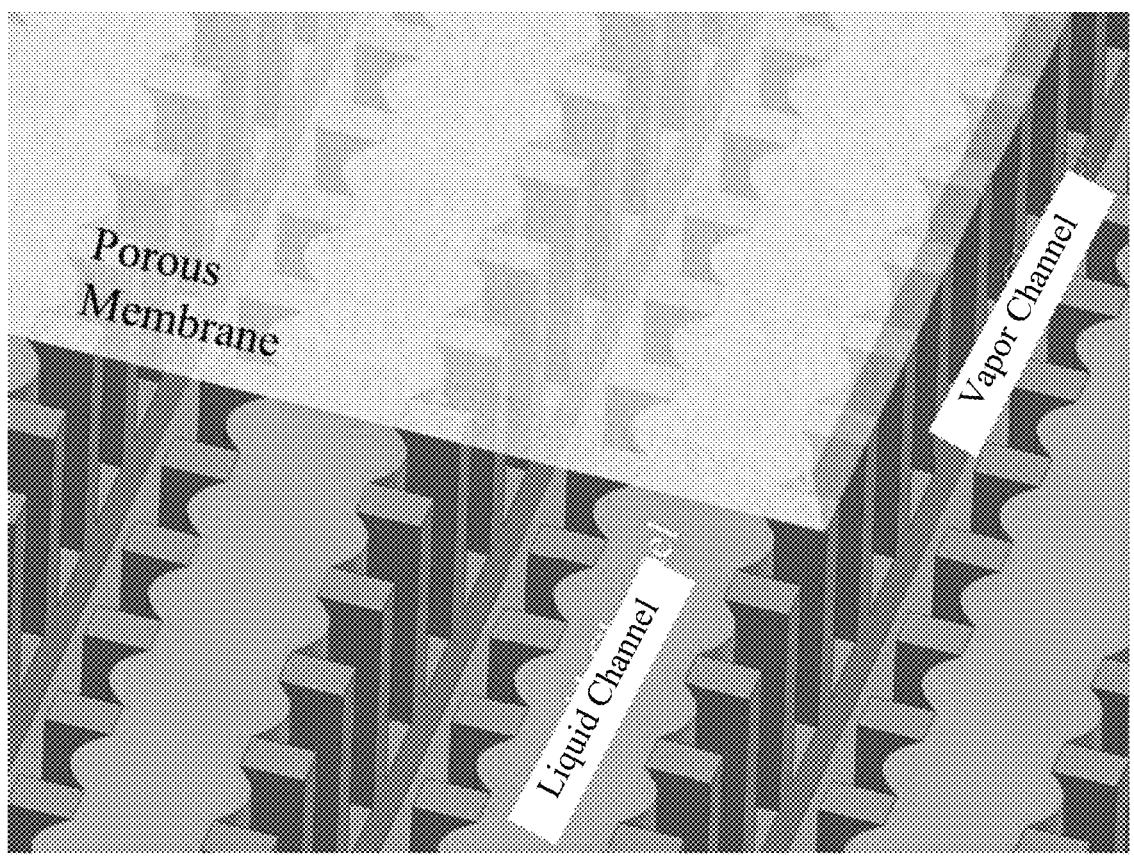

FIG. 6 is a drawing of heat sinks' liquid and vapor microchannels that are separated by arrays of equi-spaced posts that form capillary forced valves between the liquid and vapor microchannels, according to an embodiment of the invention.

Figure 7:
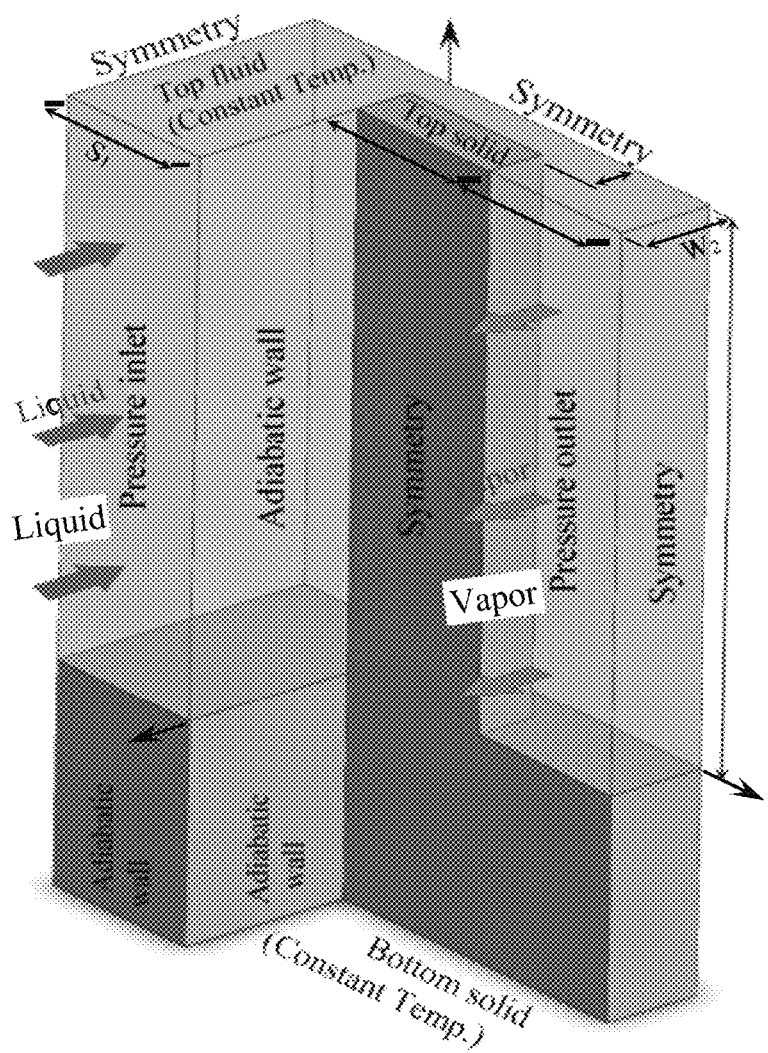

FIG. 7 is a schematic of a unit cell of the embedded evaporative heat sink formed at the capillary forced valves formed between the micro-posts as shown in FIG. 6, according to an embodiment of the invention.

Figure 8:
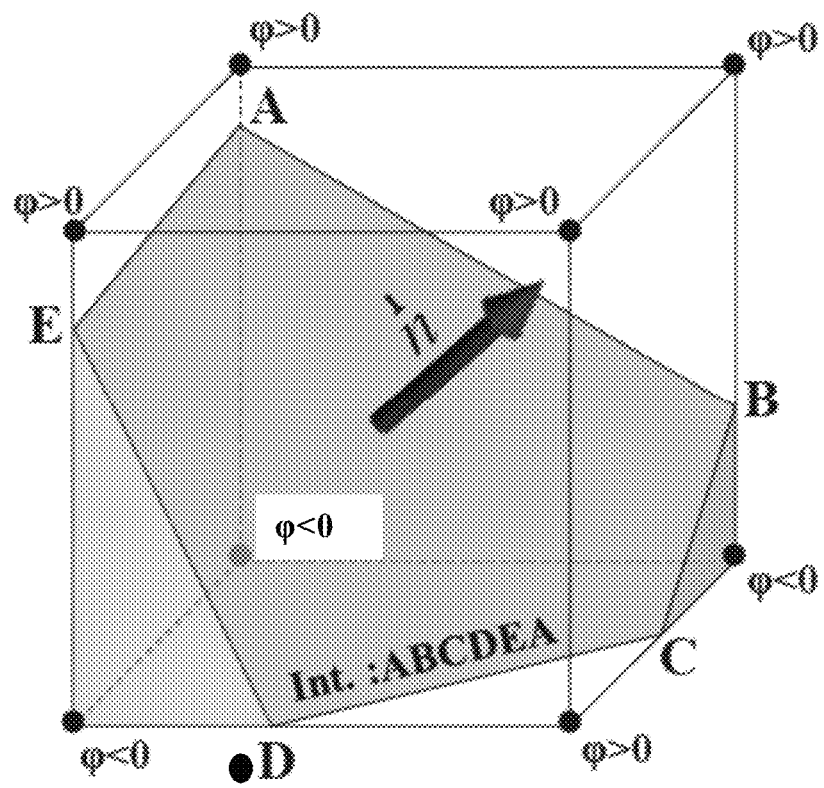

FIG. 8 is a schematic of the computational domain of the unit cell of FIG. 7 which is discretized by structured hexahedron meshes for computation of the characteristics of a heat sink, according to an embodiment of the invention.

Figure 9A:
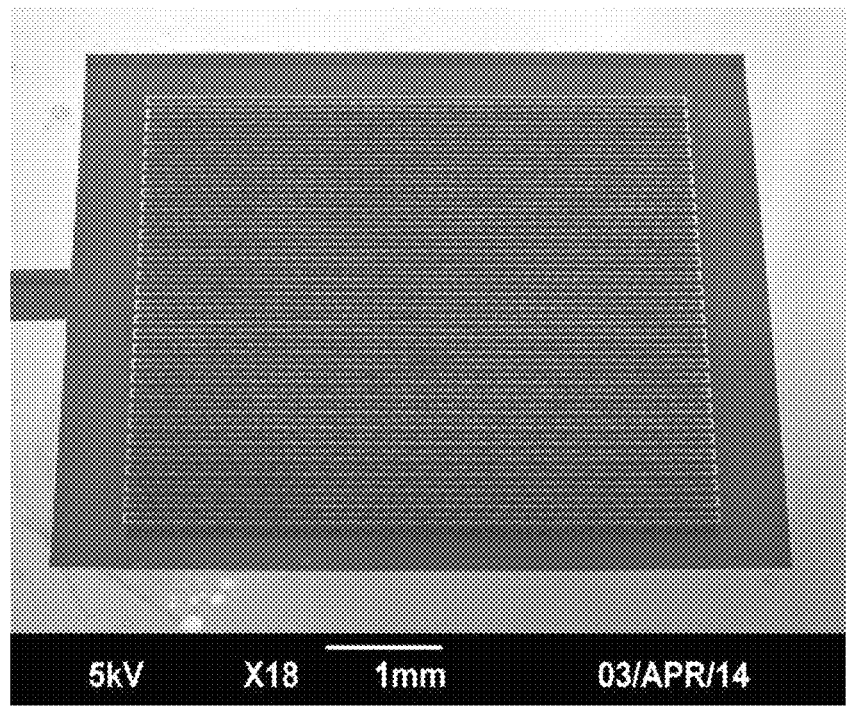

FIG. 9A shows a photograph of the exemplary heat sink, according to an embodiment of the invention.

Figure 9B:
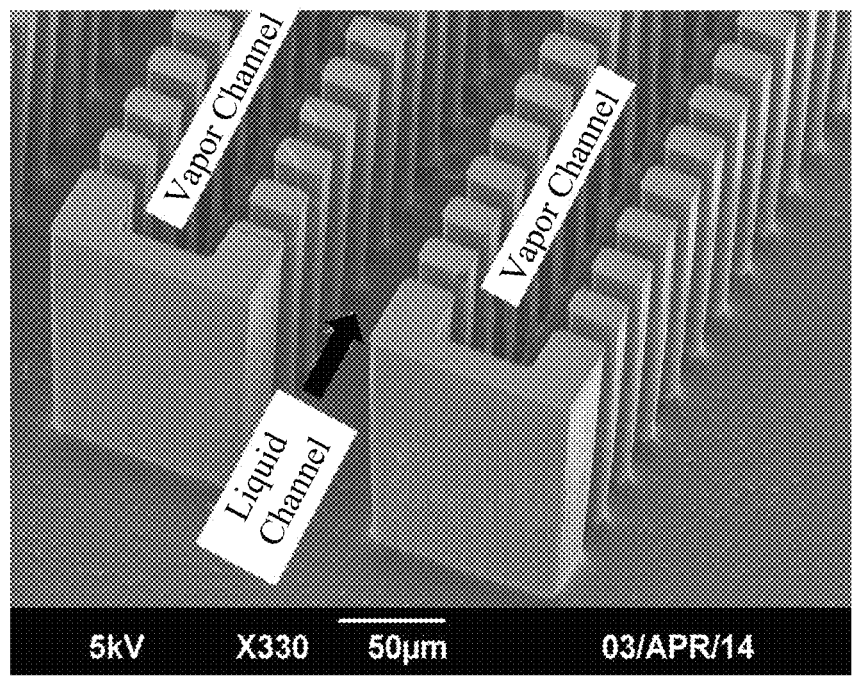

FIG. 9B shows a scanning electron microscopy (SEM) image of the liquid and vapor microchannels separated by capillary forced valves, according to an embodiment of the invention.

Figure 10:
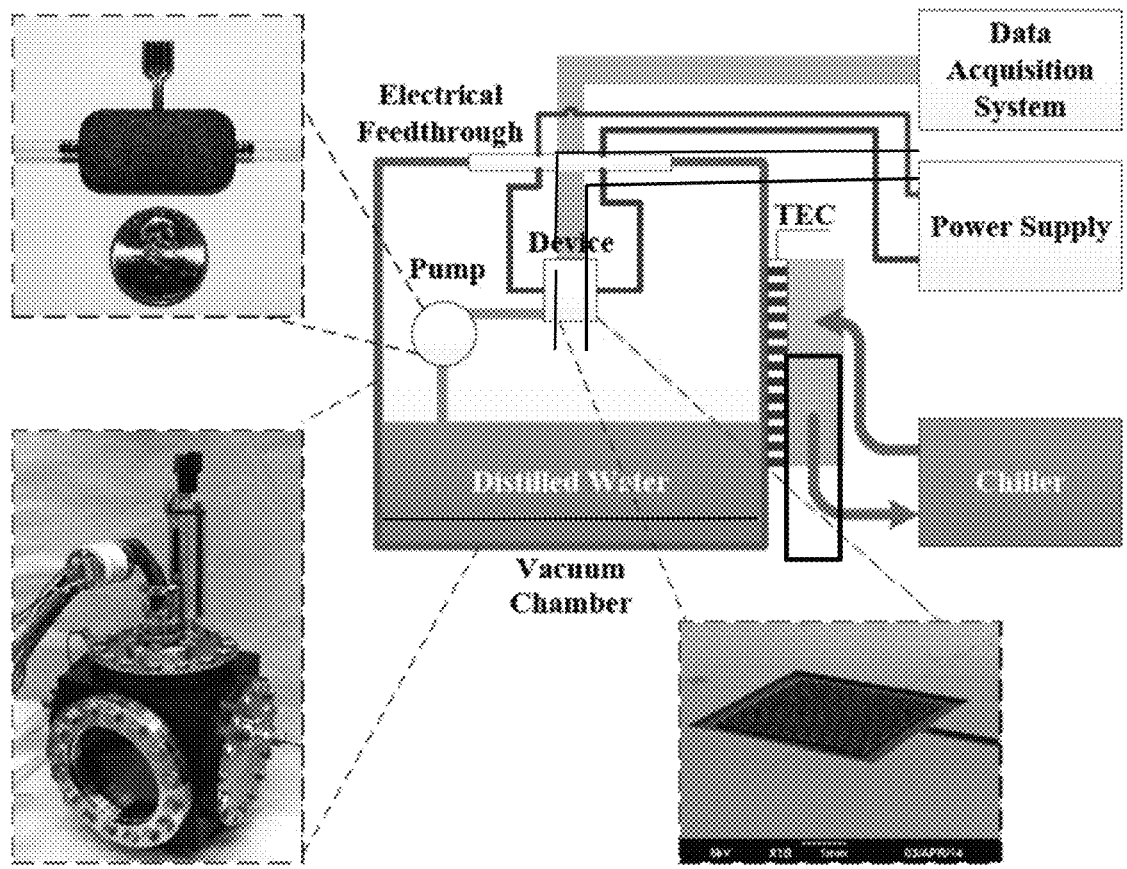

FIG. 10 is a schematic of a flow loop used to evaluate the exemplary heat sink of FIG. 9, according to an embodiment of the invention.

Figure 11A:
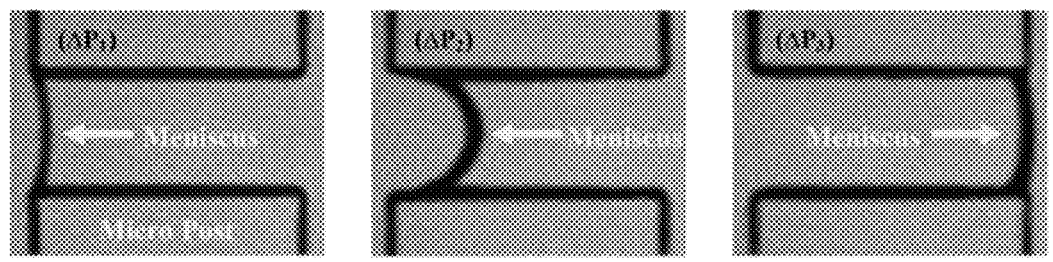

FIG. 11A is an illustration of the anticipated effect of liquid pressure on the meniscus that forms the capillary forced valve as a top view at the middle of a microchannel, $z=75$ μm.

Figure 11B:
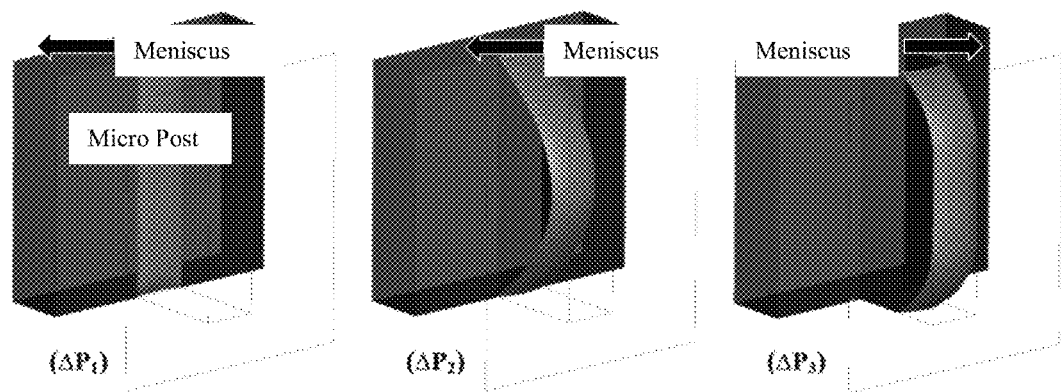

FIG. 11B is a numerical simulation of an isometric view, where $\Delta P_3 > \Delta P_2 > \Delta P_1$.

Figure 12B:
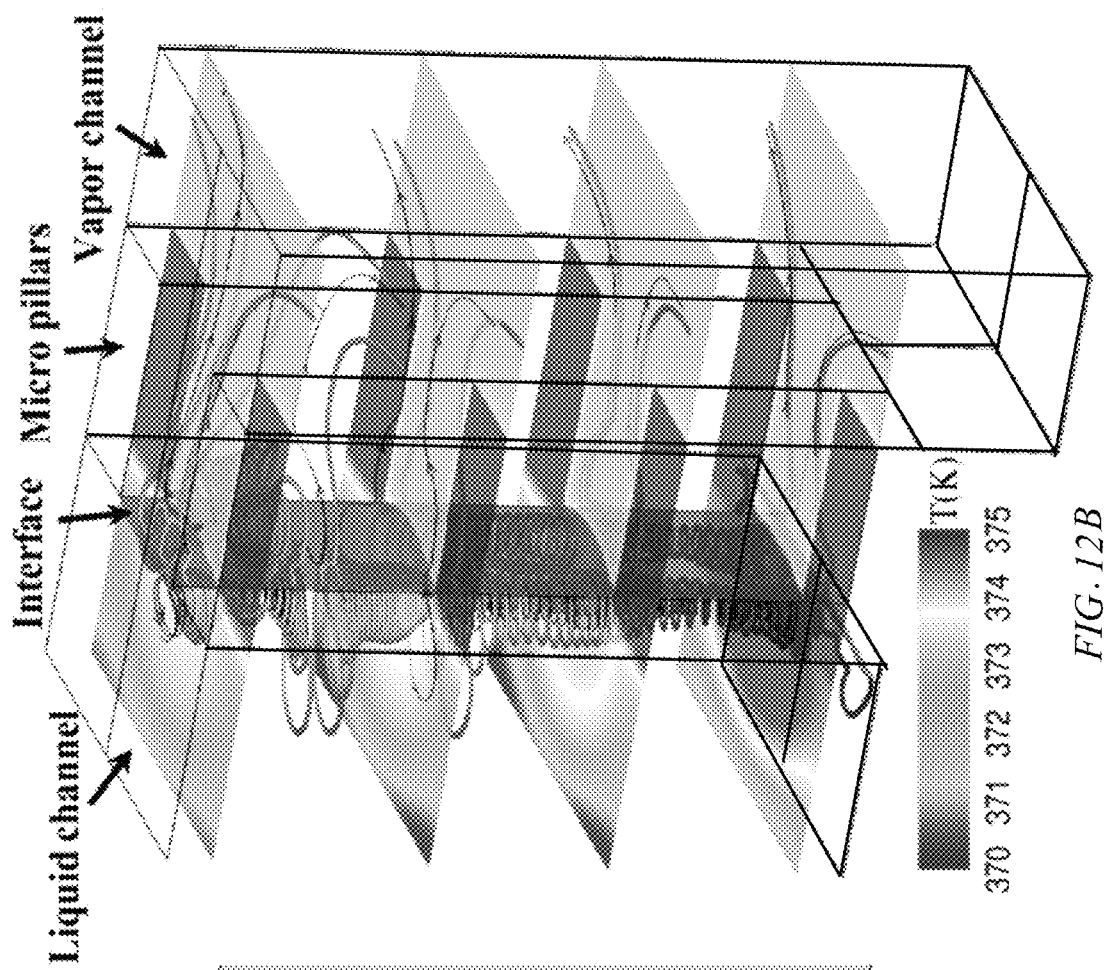
Figure 12A:
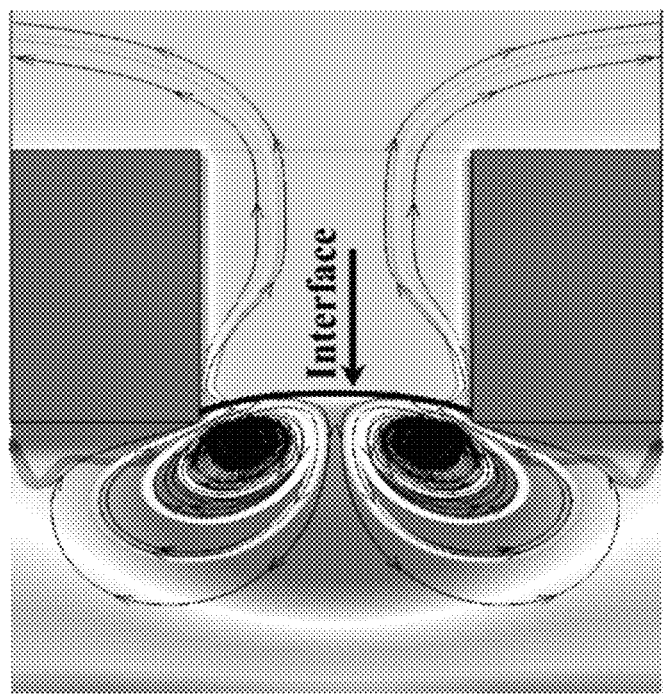

FIG. 12A is a drawing of the effect of supplied pressure on the meniscus illustrating a view at a plane at the middle of microchannel, $z=75$ μm.

FIG. 12B is a drawing of the effect of supplied pressure on the meniscus illustrating an isometric view over the height of the posts where $\Delta P_3 > \Delta P_2 > \Delta P_1$.

Figure 13A:
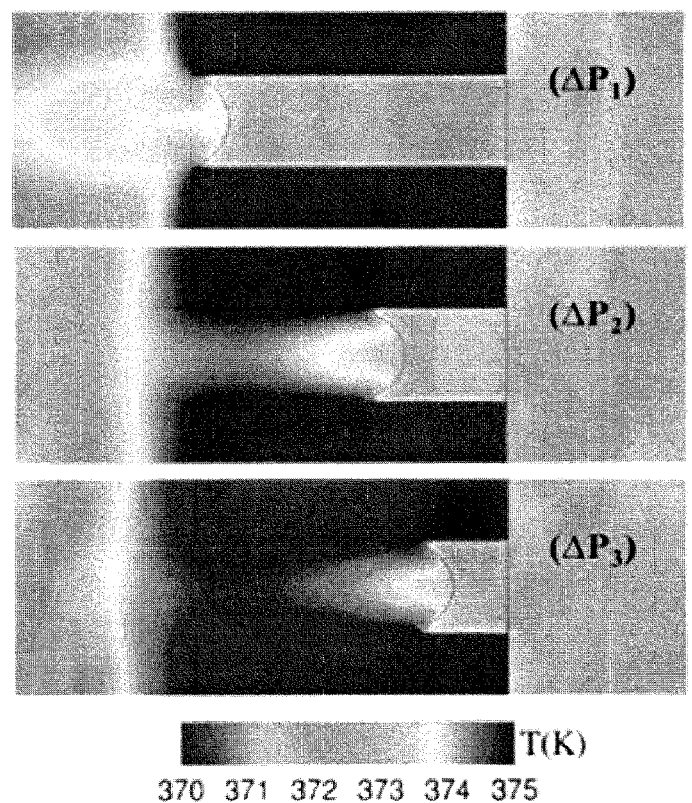

FIG. 13A illustrates the effect of liquid pressure on the meniscus and temperature distribution ($\Delta P_3 > \Delta P_2 > \Delta P_1$).

Figure 13B:
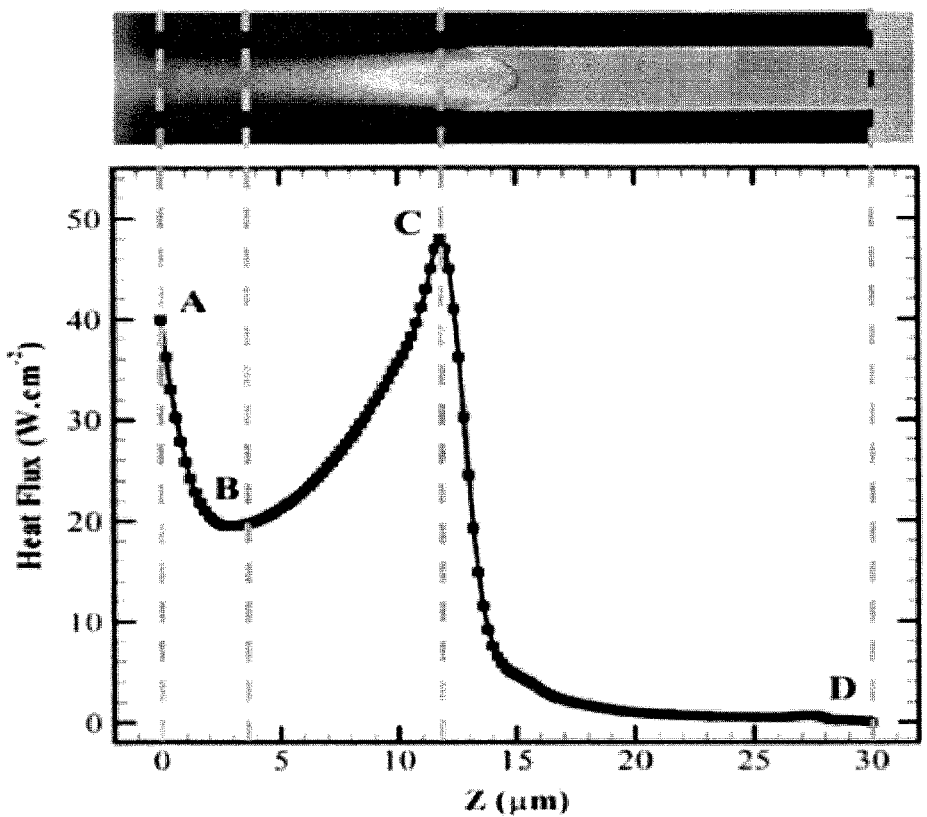

FIG. 13B illustrates local wall heat flux variations for the device of FIG. 13A over the side wall of the micro-pillars with pressure, according to an embodiment of the invention.

Figure 14A:
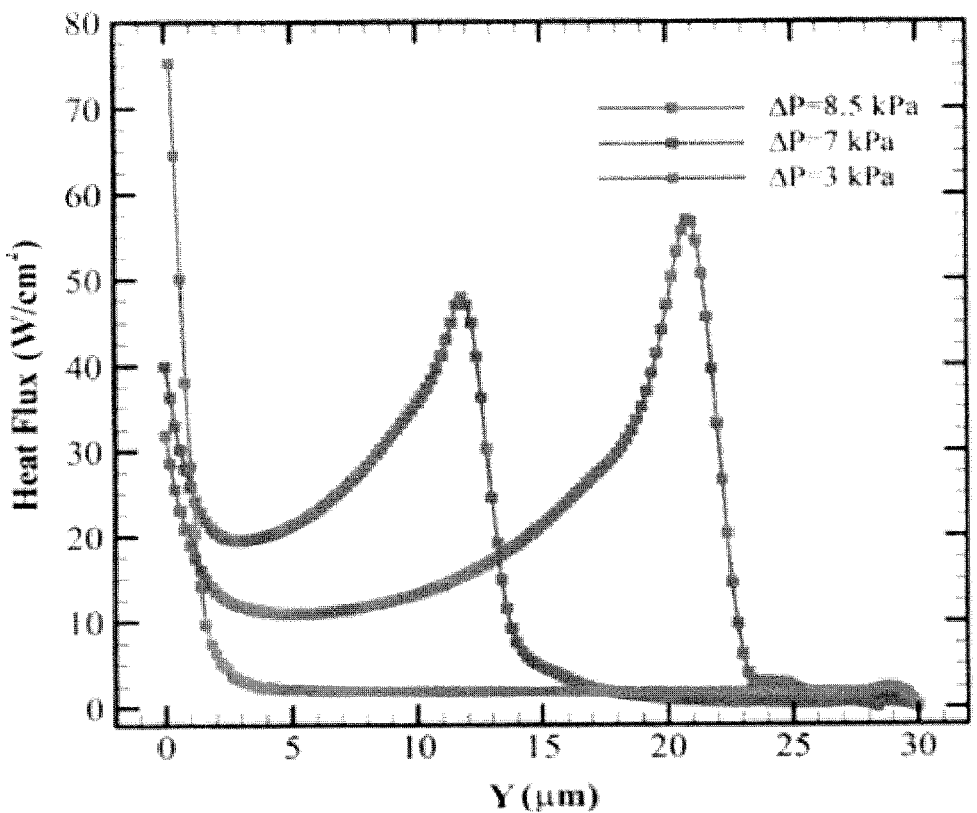

FIG. 14A is a plot of wall heat flux variations over the side wall of the fins as a function of supplied pressure ($z=50$ μm).

Figure 14B:
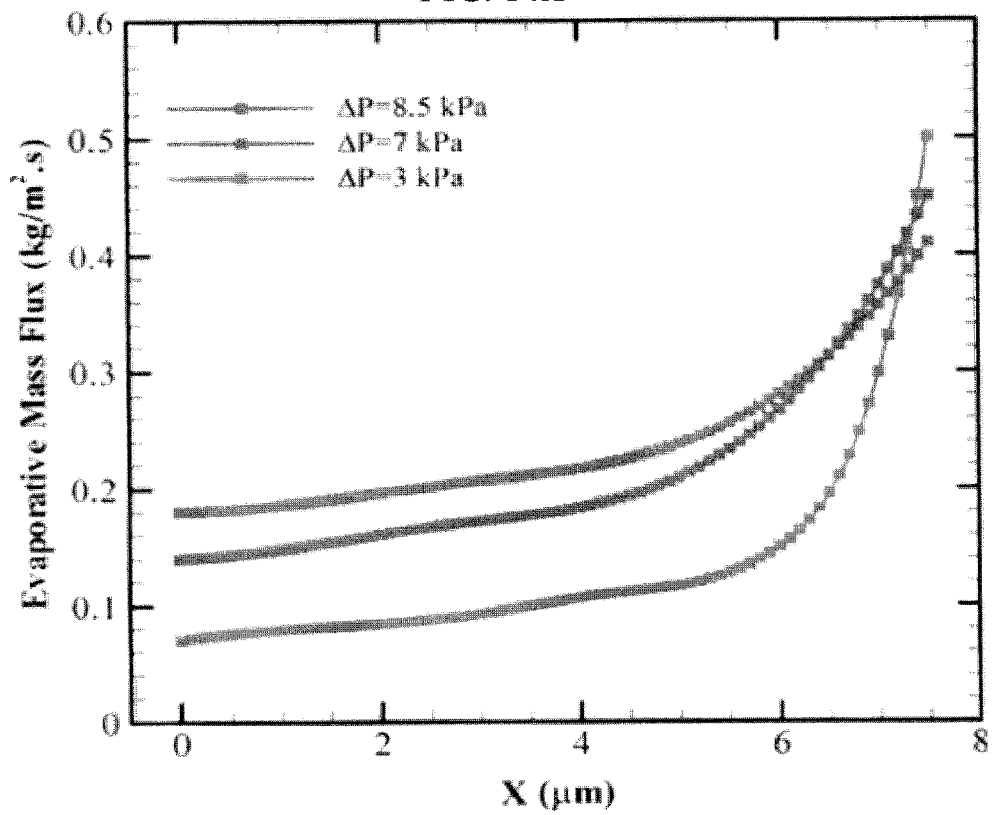

FIG. 14B is a plot of local evaporative mass flux over the liquid-vapor interface as a function of supplied pressure ($z=50$ μm).

Figure 15A:
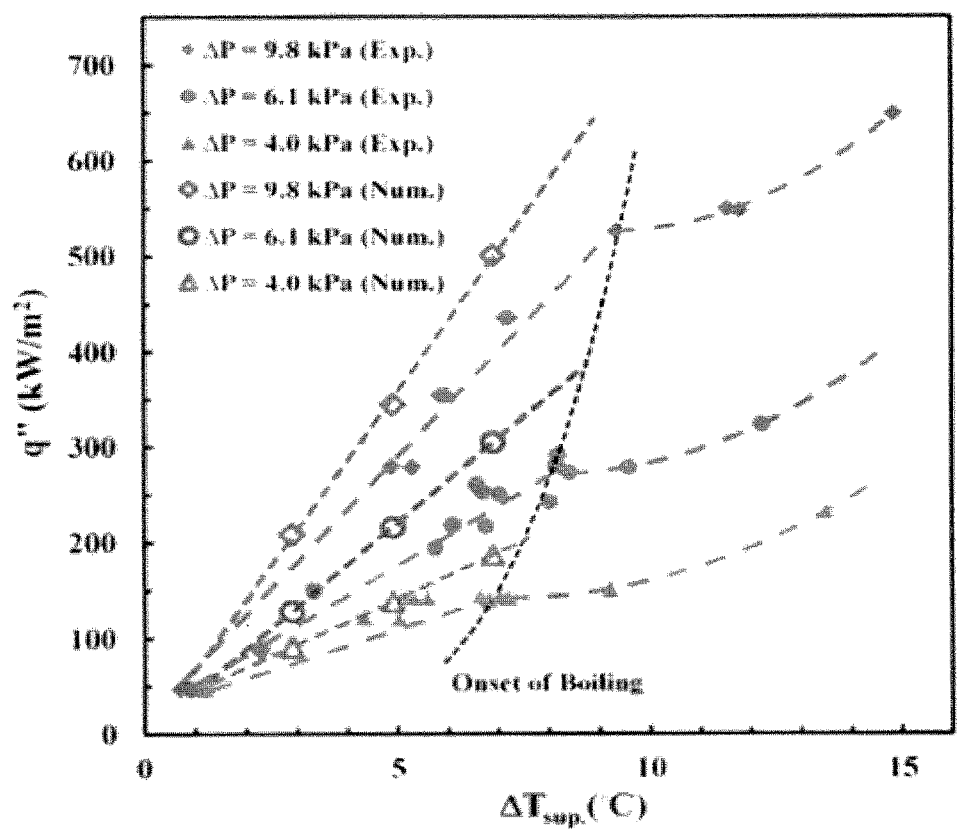

FIG. 15A is a plot of experimental heat flux data as a function of wall superheat at different supplied liquid pressures.

Figure 15B:
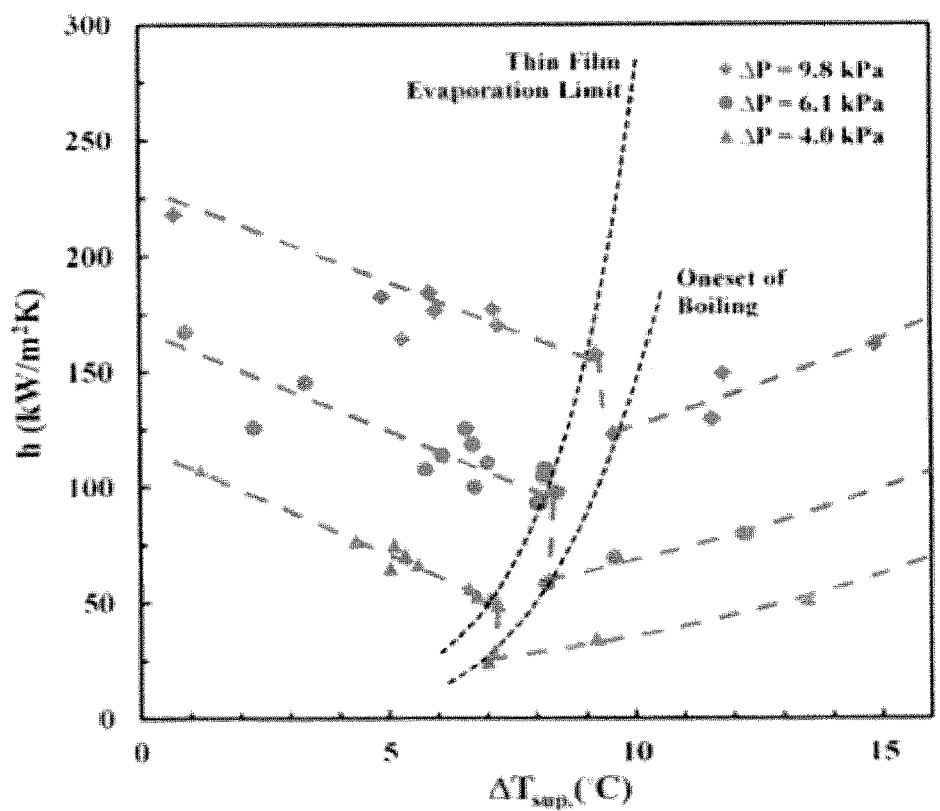

FIG. 15B is a plot of calculated heat transfer coefficients vs. wall superheat at different supplied liquid pressures for the heat sink device of FIG. 9A, according to an embodiment of the invention.

Figure 16:
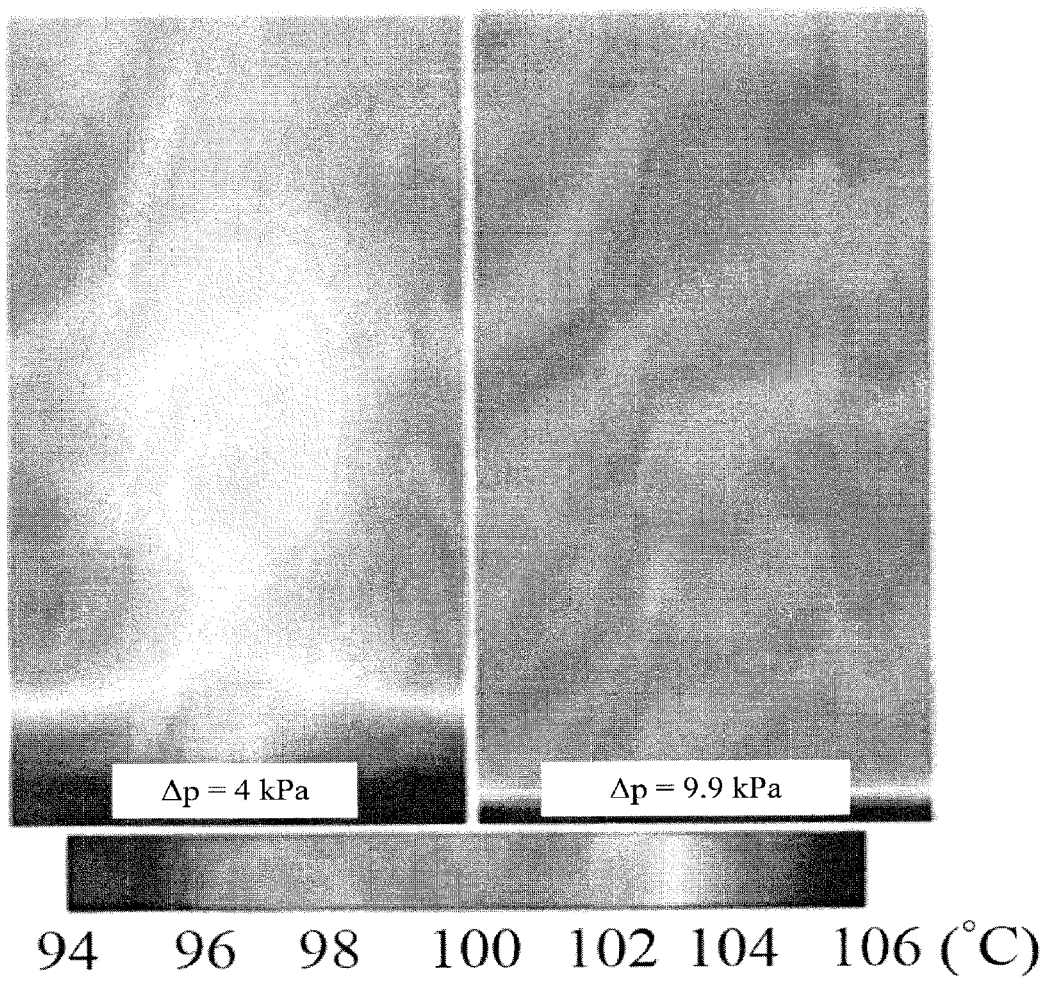

FIG. 16 shows numerical temperature contour maps of the liquid at a relatively low liquid pressure, left, and a relatively high liquid pressure, right, for a heat sink device of FIG. 9A, according to an embodiment of the invention.

Figure 17:
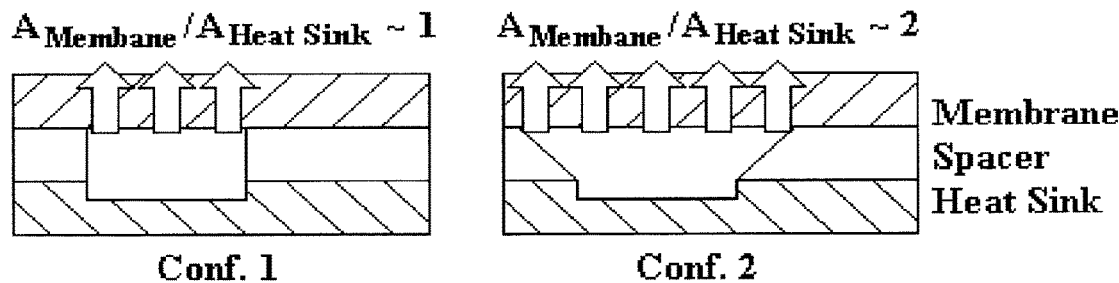

FIG. 17 shows cross-section drawings of two different configurations differing by the surface area of the liquid-vapor microchannel due to the geometry of the spacers separating the heat sink from the membrane, according to embodiments of the invention.

Figure 18:
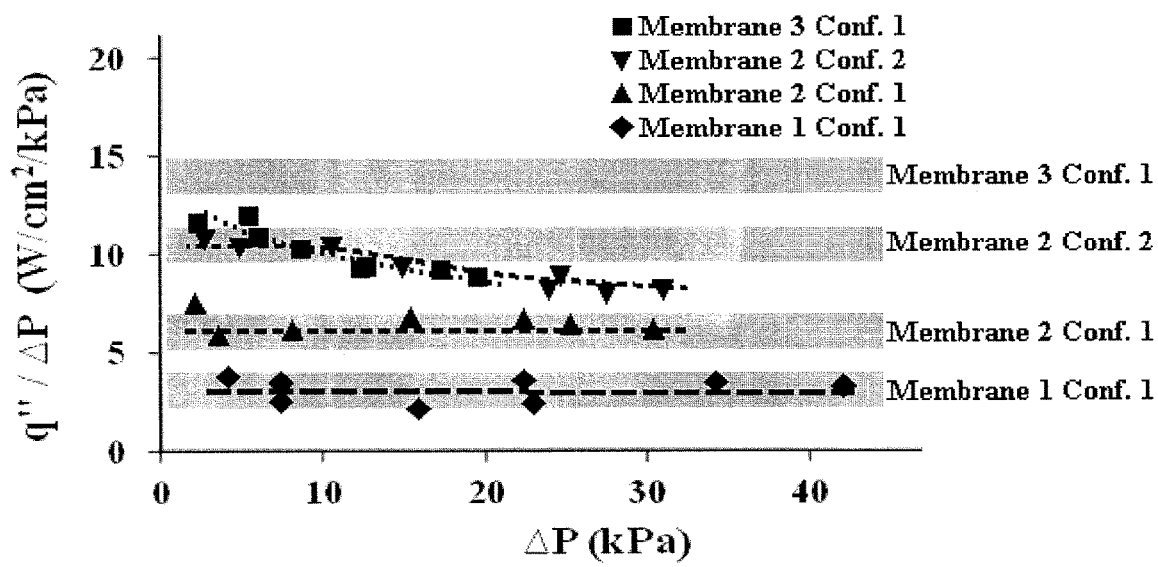

FIG. 18 shows a plot of the heat flux per the pressure drop in the microchannel versus the pressure drop between the liquid and vapor water for the two configurations of FIG. 17, according to an embodiment of the invention, for the three membranes of Table 2 with respect to the theoretical limit (broad solid line) for each combination, illustrating the effect of the membrane properties.

Figure 19:
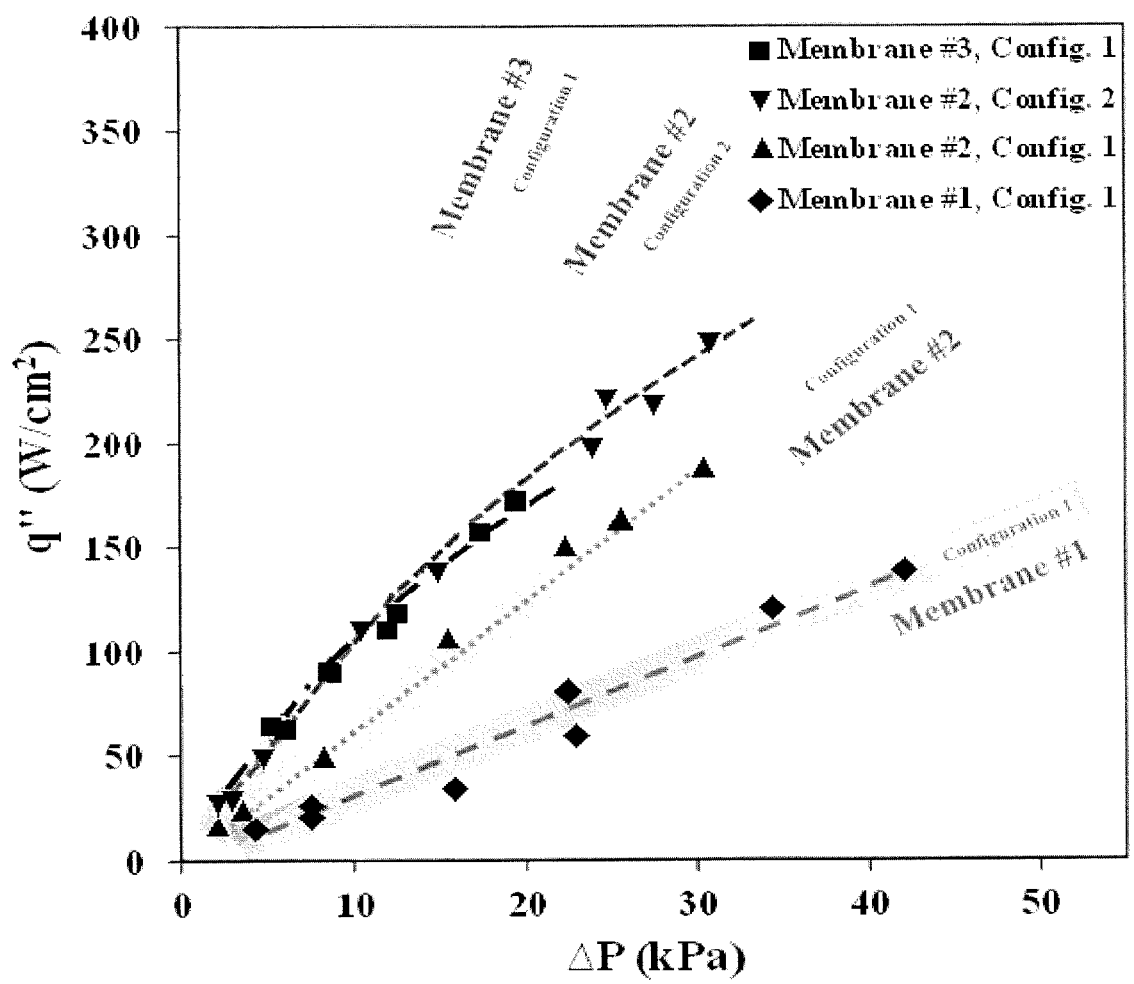

FIG. 19 shows a plot of the heat flux versus the pressure drop in the microchannel for the two configurations of FIG. 17, according to an embodiment of the invention for the three membranes of Table 2 with respect to the theoretical limit (broad solid line) for each combination.

Figure 20:
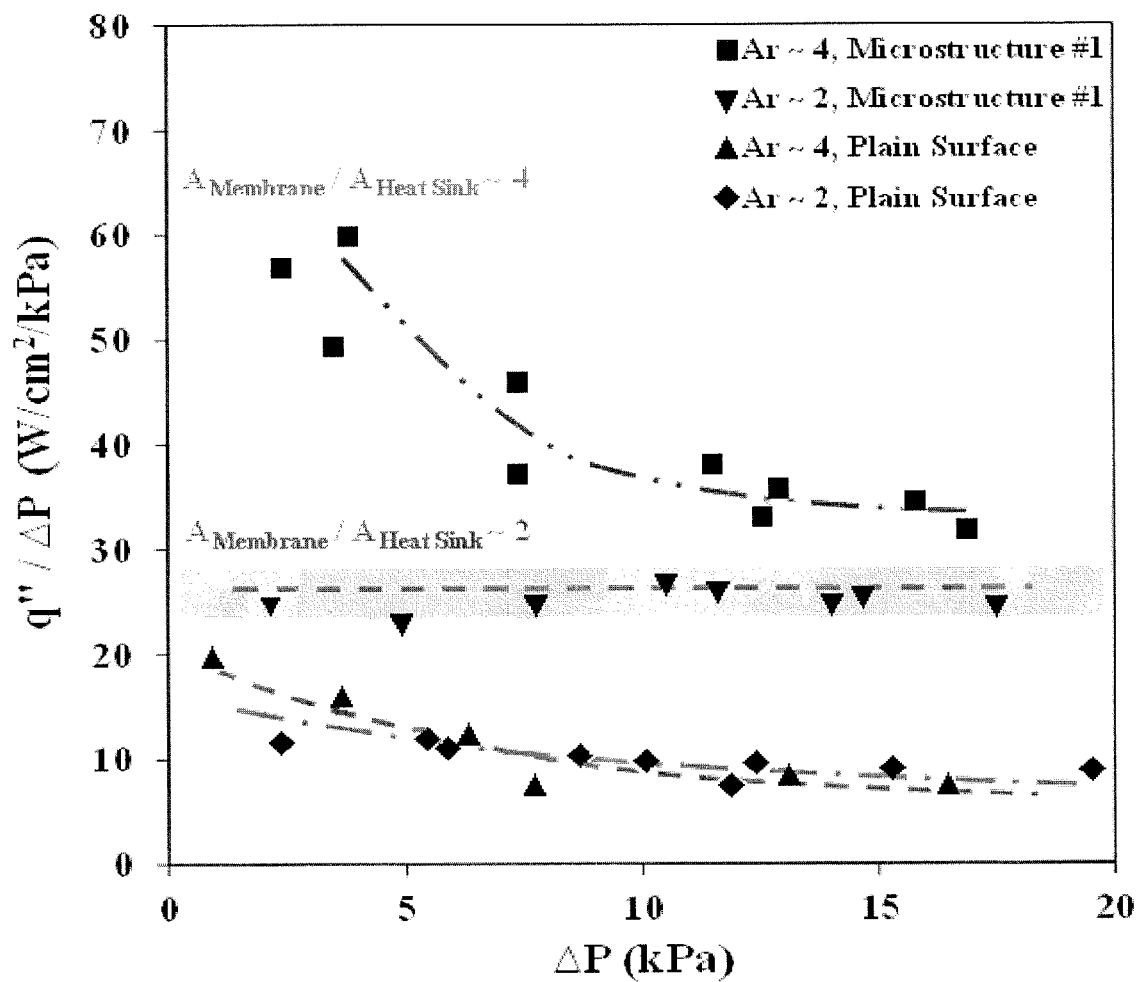

FIG. 20 shows a plot of the heat flux per the pressure drop in the microchannel versus the pressure drop between the liquid and vapor water for microstructure 1 of Table 3, according to an embodiment of the invention, and a plane surface with respect to the theoretical limit (broad solid line) for each combination, illustrating the effect of the membrane area.

Figure 21:
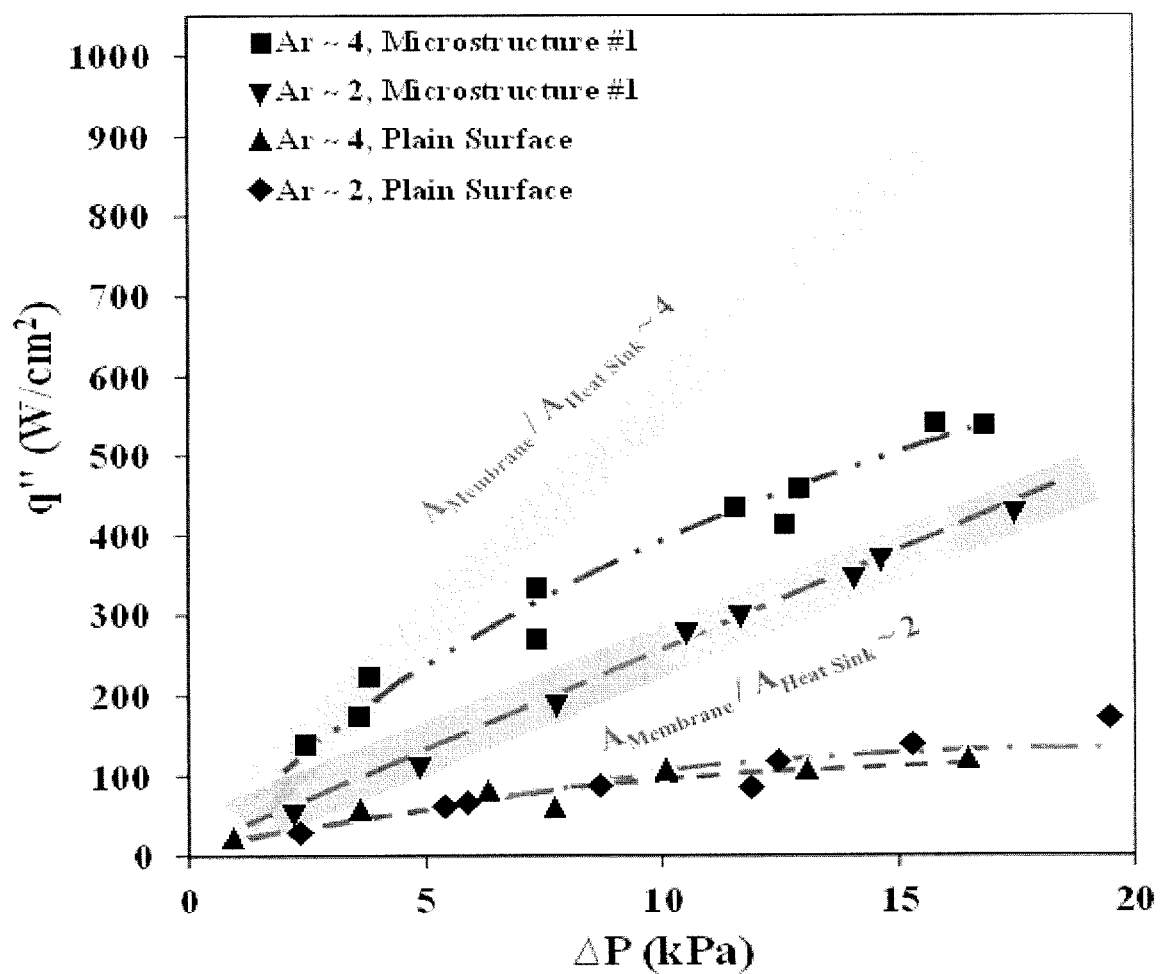

FIG. 21 shows a plot of the heat flux versus the pressure drop in the microchannel between the liquid and vapor water for microstructure 1 of Table 3, according to an embodiment of the invention, and a plane surface with respect to the theoretical limit (broad solid line) for each combination.

Figure 22:
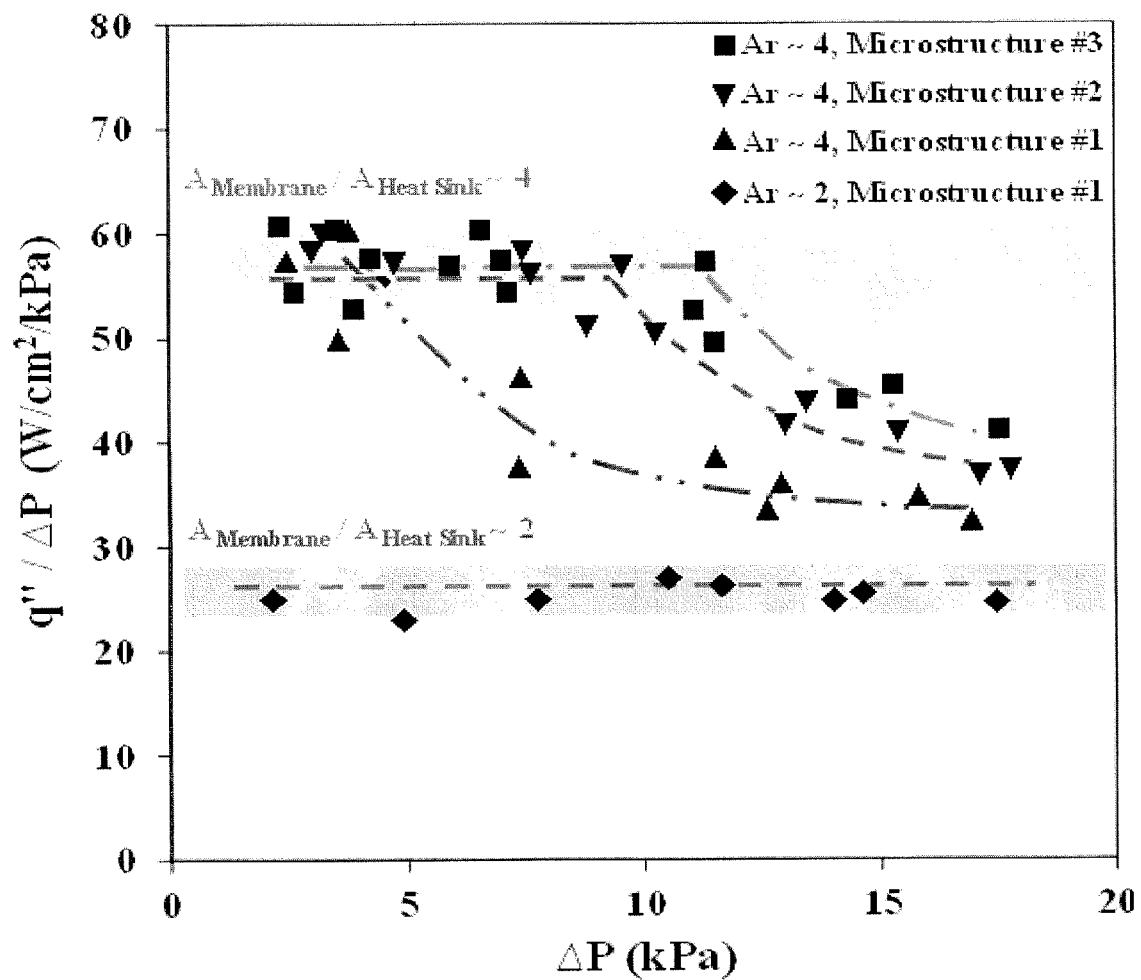

FIG. 22 shows a plot of the heat flux per the pressure drop in the microchannel versus the pressure drop between the liquid and vapor water for microstructures of Table 3, according to an embodiment of the invention, with respect to the theoretical limit (broad solid line) for each combination, illustrating the effect of the wickability of the microstructures.

Figure 23:
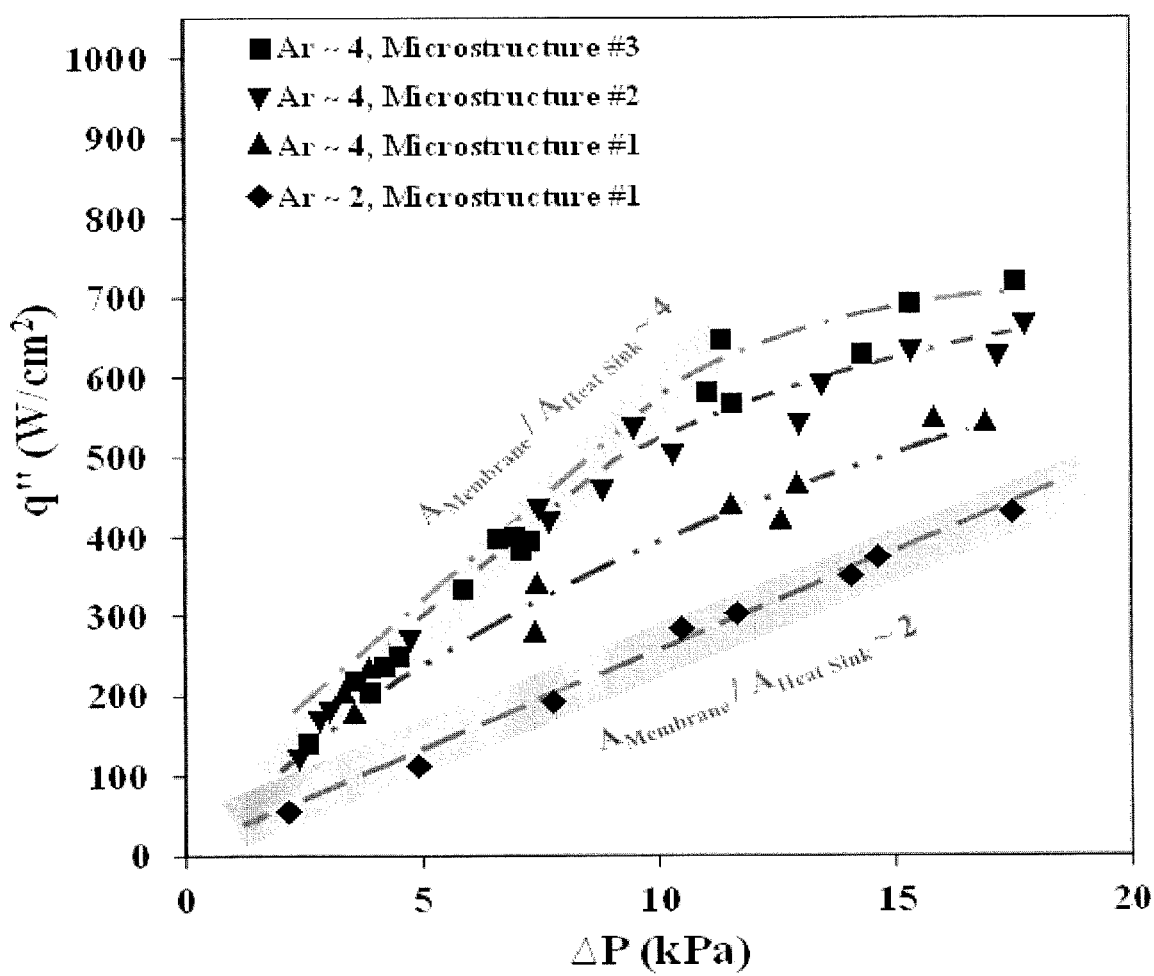

FIG. 23 shows a plot of the heat flux versus the pressure drop in the microchannel between the liquid and vapor water for microstructures of Table 3, according to an embodiment of the invention, with respect to the theoretical limit (broad solid line) for each combination.

Figure 24:
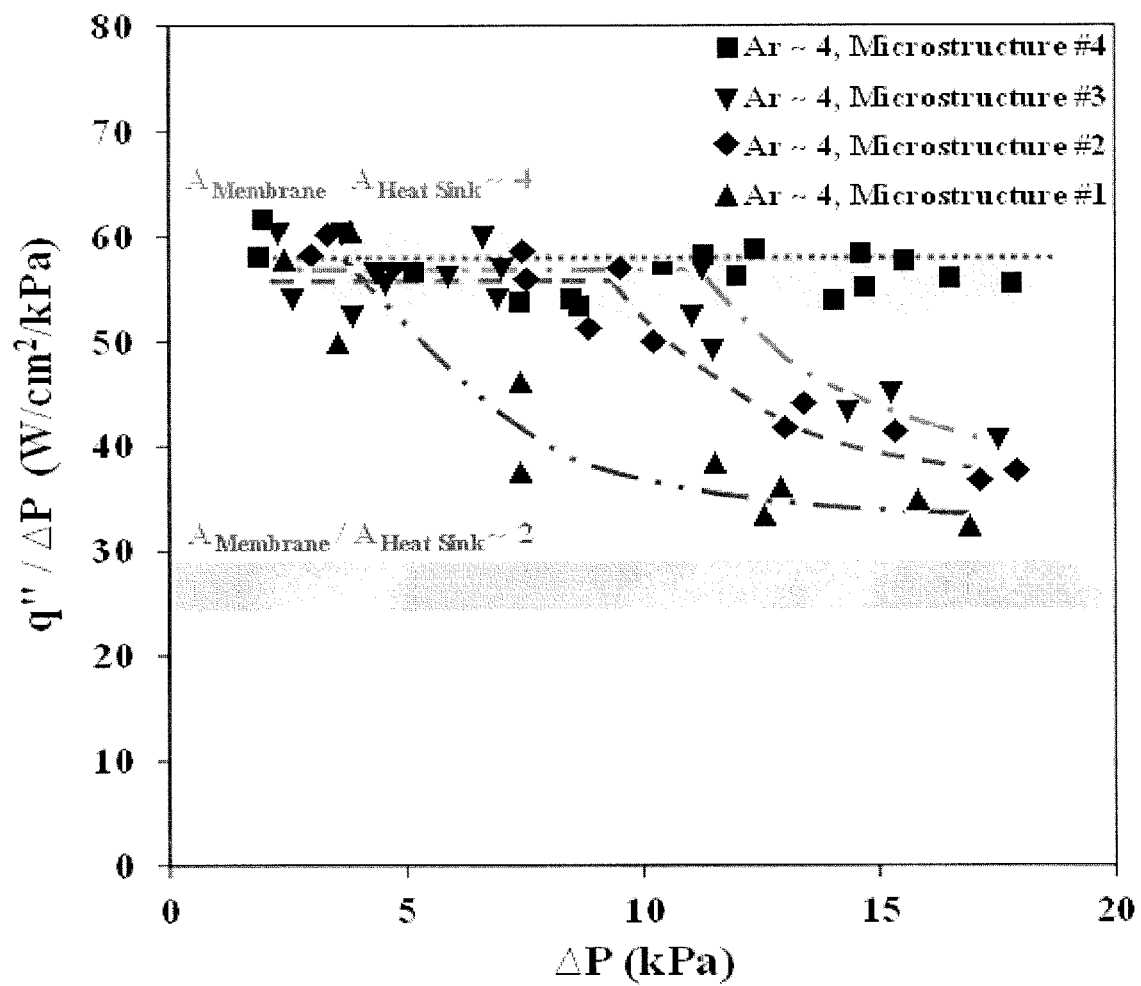

FIG. 24 shows a plot of the heat flux per the pressure drop in the microchannel versus the pressure drop between the liquid and vapor water for microstructures of Table 3, according to an embodiment of the invention, with respect to the theoretical limit (broad solid line) for each combination, illustrating the effect of the surface roughness of the microstructures.

Figure 25:
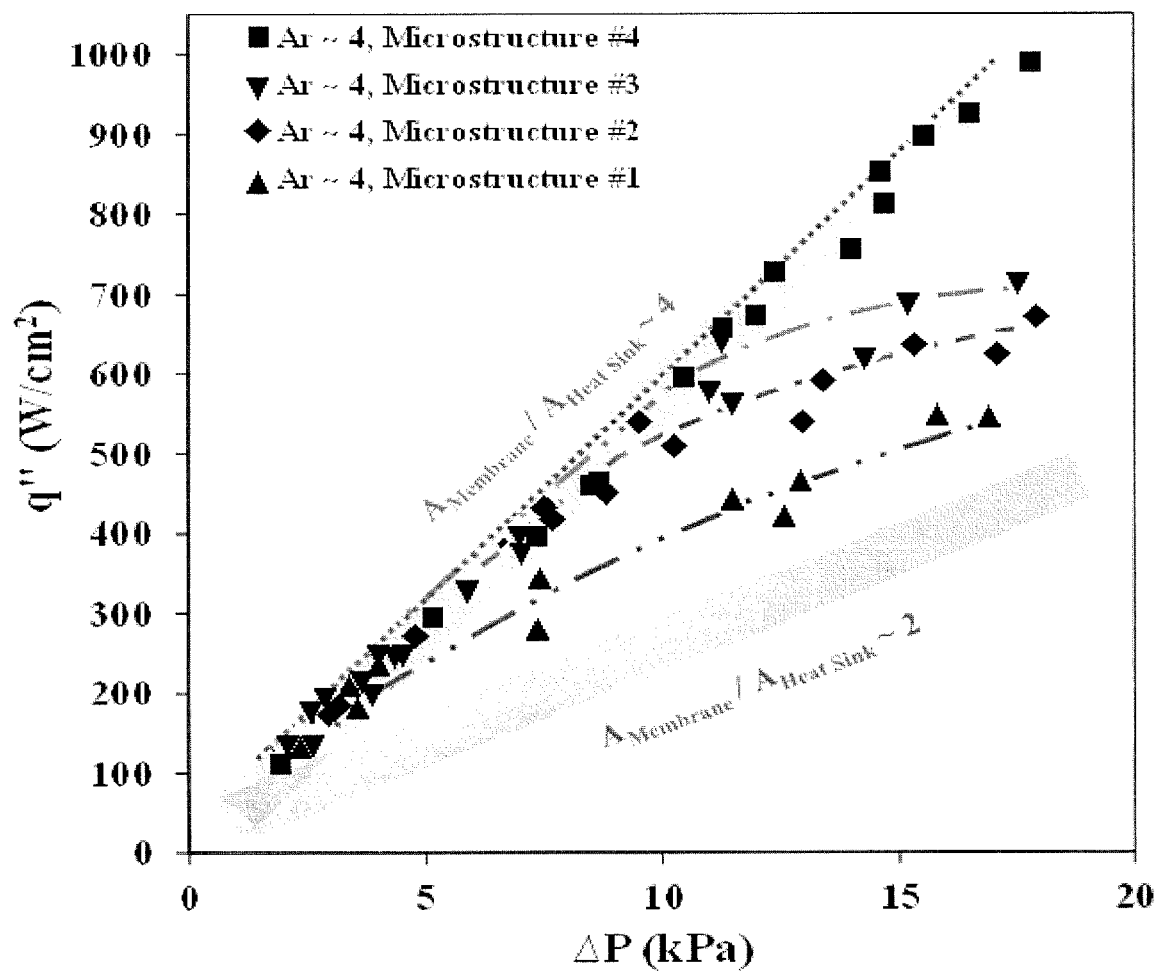

FIG. 25 shows a plot of the heat flux versus the pressure drop in the microchannel between the liquid and vapor water for microstructures of Table 3, according to an embodiment of the invention, with respect to the theoretical limit (broad solid line) for each combination.

Figure 26:
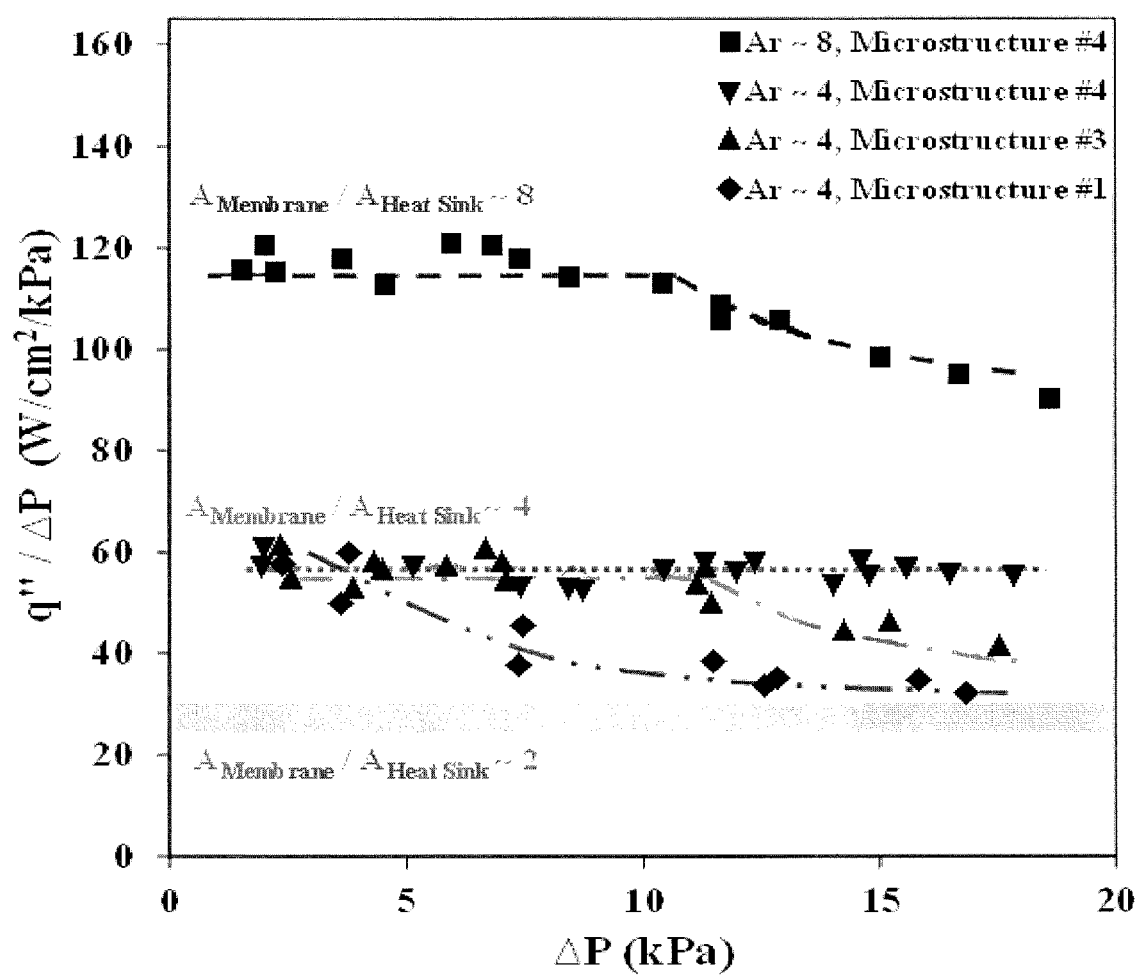

FIG. 26 shows a plot of the heat flux per the pressure drop in the microchannel versus the pressure drop between the liquid and vapor water for microstructures of Table 3, according to an embodiment of the invention, with respect to the theoretical limit (broad solid line) for each combination, illustrating the combined effect of the surface roughness of the microstructures and membrane area.

Figure 27:
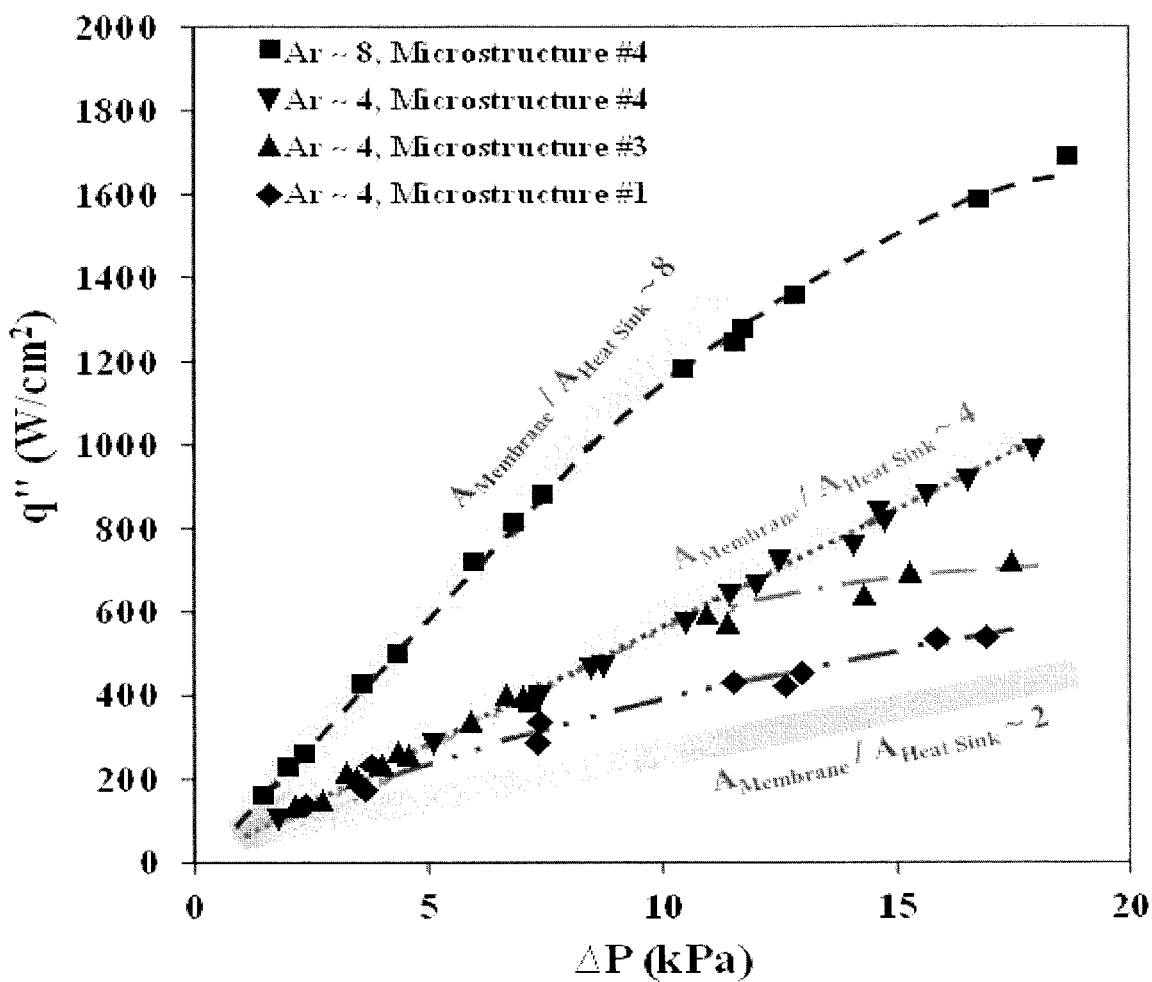

FIG. 27 shows a plot of the performance relative to theoretical limits of the heat sink with respect to heat flux versus the pressure drop for the microstructures of Table 3, according to an embodiment of the invention.

Figure 28:
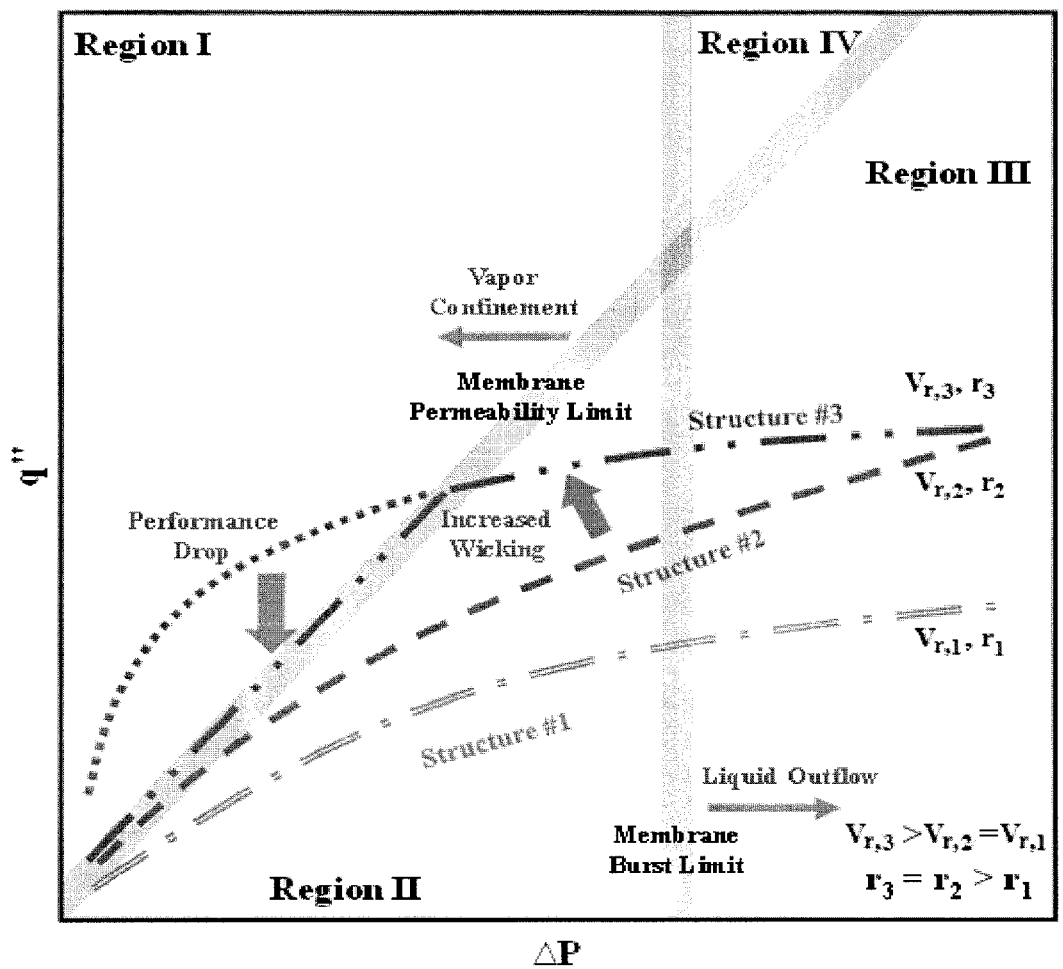
Figure 29:
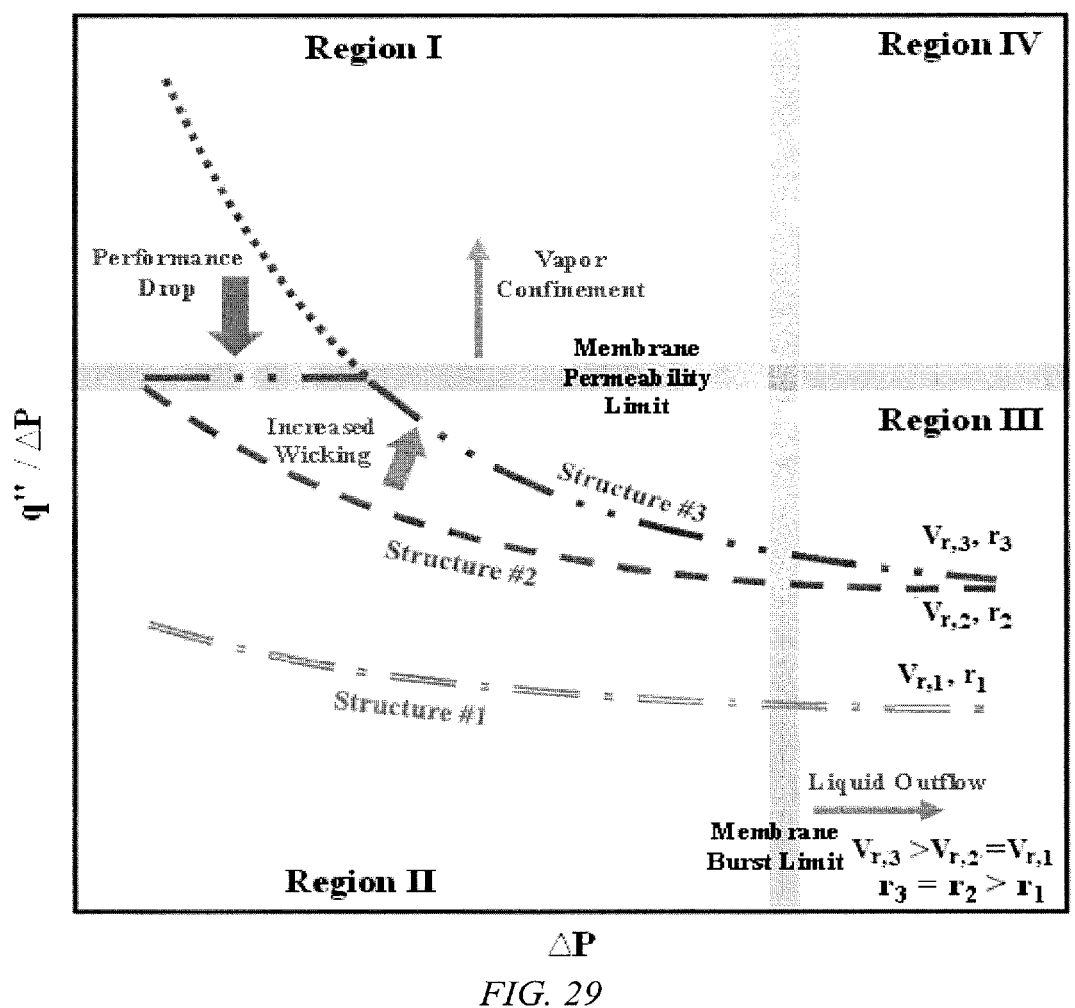

FIG. 28 and FIG. 29 show a plot of the performance relative to theoretical limits of the heat sink with respect to the microstructures with heat flux per the pressure drop in the microchannel versus the pressure drop, according to an embodiment of the invention.

DETAILED DESCRIPTION

Figure 1:
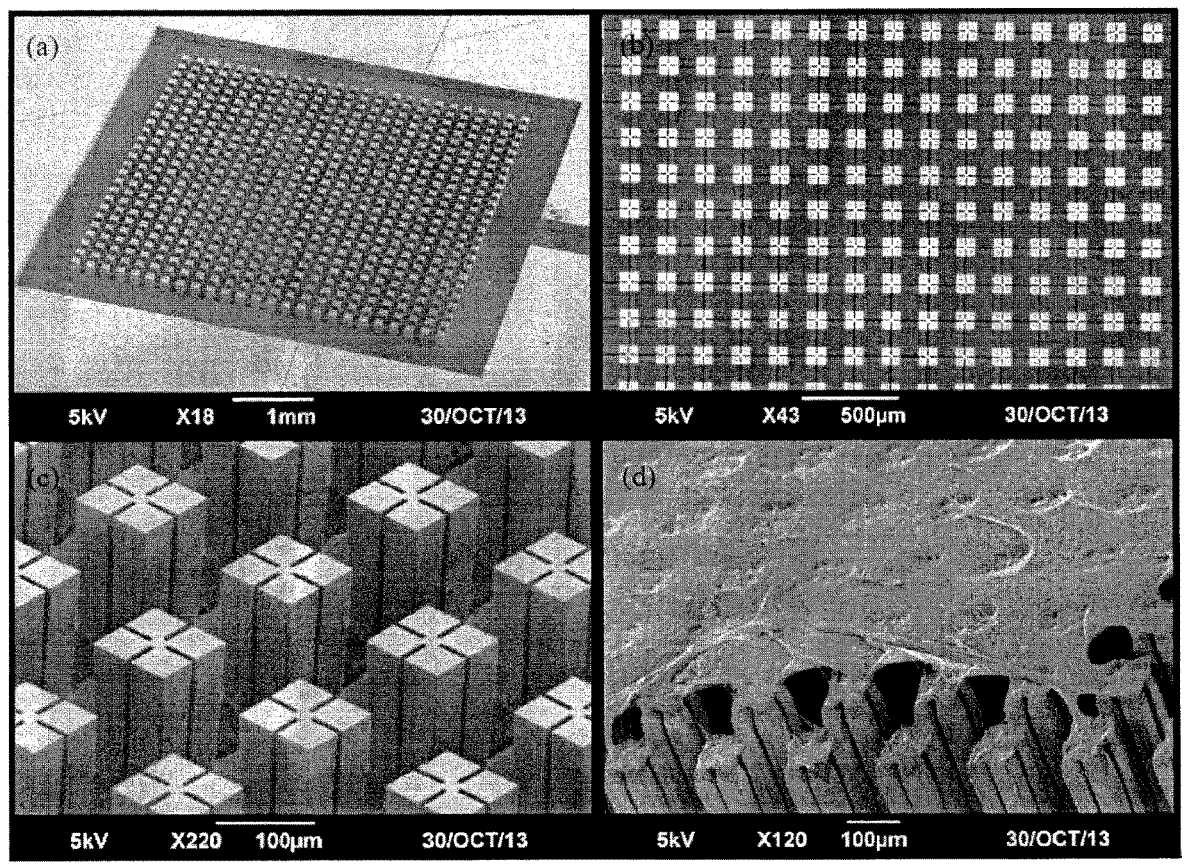
FIG. 1 shows images of portions of the heat sink: a) an isometric view of the device's active area; b) scanning electron microscopy (SEM) image of a top view of the active area; c) a further magnified view of the fins of the active area; and d) the supported membrane, according to an embodiment of the invention.

Embodiments of the invention are directed to heat sinks that require, but are not limited to, a single liquid fluid inlet and have exclusively a vapor fluid outlet through a membrane. The liquid fluid portion of a heat sink, according to an embodiment of the invention, is illustrated in FIG. 1. The fluid can be any fluid, ranging from water through hydrofluorocarbon refrigerants, for example: trifluoromethane, difluoromethane, fluoromethane, pentafluoroethane, pentafluorodimethyl ether, 1,1,2,2-tetrafluoroethane, 1,1,1,2-tetrafluoroethane, bis(difluoromethyl)ether, 1,1,2-trifluoroethane, 1,1,1-trifluoroethane, methyl trifluoromethyl ether, 2,2,2-trifluoroethyl methyl ether, 1,2-difluoroethane, 1,1-difluoroethane, fluoroethane, 1,1,2,2,3,3,3-heptafluoropropane, trifluoromethyl 1,1,2,2-tetrafluoroethyl ether, 1,1,1,2,3,3,3-heptafluoropropane, trifluoromethyl 1,2,2,2-tetrafluoroethyl ether, 1,1,1,2,2,3-hexafluoropropane, 1,1,1,2,3,3-hexafluoropropane, 1,1,1,3,3,3-hexafluoropropane, 1,2,2,2-tetrafluoroethyl difluoromethyl ether, hexafluoropropane, 1,1,2,2,3-pentafluoropropane, pentafluoropropane, 1,1,2,3,3-pentafluoropropane, 1,1,1,2,3-pentafluoropropane, 1,1,1,3,3-pentafluoropropane, methyl pentafluoroethyl ether, difluoromethyl 2,2,2-trifluoroethyl ether, difluoromethyl 1,1,2-trifluoroethyl ether, 1,1,2,2-tetrafluoropropane, methyl 1,1,2,2-tetrafluoroethyl ether, trifluoropropane, or any fluorocarbon or hydrofluorocarbon. In general, flammable fluids are avoided, but there is no limitation to the fluid as long as the boiling point is about 100° C. or less. In an embodiment of the invention, the membrane is a nanostructured membrane that is of a hydrophobic material. Hydrophobic materials are defined as any material upon which a water droplet displays a contact angle of at least 90 degrees. For example, an exemplary membrane is a polytetrafluoroethylene (PTFE) nanofiber membrane. Any other material can be used as long as the material is hydrophobic as defined by the water contact angle.

The membrane is supported by fins, which are supports that extend perpendicularly from the base of the heat sink in the active area of the heat sink, where the base is the surface through which heat is transferred from the microelectronic device to the fluid through the exposed base surface and the surfaces of the fins. The fins can have any geometry that allows the flow of a refrigerant between the fins. The fins permit fluid to flow from multiple sides and are not restricted to flow from one dimension, as is common to current microchannel heat sink devices. The fins have dimensions of about 1 to about 200 micrometer in cross-section and have a height that is equal to or greater than the cross-section and can be about 250 micrometers or less. The fins can be of any shape; for example, the fins can be square pillars in shape, cylinders in shape, or any polygon in shape that permits relative unimpeded flow of fluid into the active area. The fins can be patterned by voids or other features on their surfaces to increase surface area, promote nucleation of vapor, or perform any other desirable action. The fins support the membrane and can transfer heat from the base of the heat sink. The heat sink base and fins can be selected independently from any material with thermal conductivity greater than about 10 W/mK. In some embodiments of the invention, the base and the fins are of the same material. In an exemplary embodiment, the heat sink can be silicon with a thermal conductivity of 149 W/mK. Other materials that can be employed include metals and composites that include a filler of high thermal conductivity, such as metal fibers, carbon nanotubes, or graphene flakes.

In embodiments of the invention, the central portion of the heat sink is the active area that contains the fins. The active area is surrounded by trenches that fill with fluid and supply the fluid to the active area. The trenches can have the same depth as the fins, sharing a common base as that of the active area, or can be of other depths that promote regular even flow of fluid into the active area. The trenches can contain a volume of fluid that is similar to the volume of fluid that can be contained within the active area. For example, the trenches can contain about 70 to about 150 percent of the fluid volume as the active area. The active area need not be square, as illustrated in FIG. 1, but can be circular or of any other geometry. Generally, although not necessarily, the geometry of the active area is a regular geometry, for example, a regular polygon, and generally, but not necessarily, the trenches are situated regularly about the active area.

In embodiments of the invention, a second portion, not illustrated in FIG. 1, is situated on the face distal to the base of the heat sink. The second portion covers at least the active area of the first portion and directs the vapor fluid to a condenser where the vapor reverts to a liquid for reintroduction into the heat sink. The condenser is maintained at a temperature desirable to return the vapor to the liquid phase at a temperature equal to or below the temperature of the liquid introduced to the heat sink. Depending on the fluid employed and the pressure maintained within the system, the temperature can be sub-ambient to temperatures higher than the boiling point of the fluid at ambient pressures. The pressures can be sub-ambient to multiple atmospheres, depending upon the heat sink material's ability to safely maintain that pressure, where, for example, for a metal heat sink, pressures in excess of 100 psi are possible. The liquid fluid can return to the heat sink from the condenser by the force of gravity or as provided by a pump. The condenser or any fluid reservoir downstream of the condenser can be used to feed one or more heat sinks.

Figure 2:
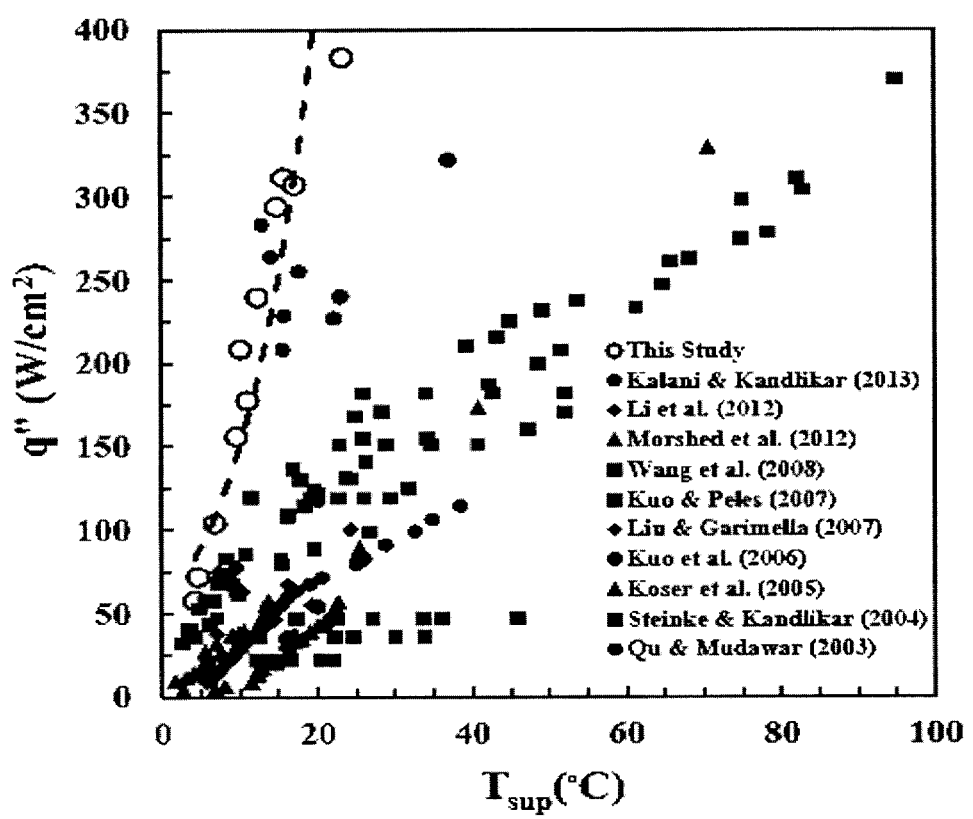

The exemplary heat sink, of the design indicated in FIG. 1, can provide vastly superior performance to that of state of the art heat sinks for microelectronic devices. As can be seen in FIG. 2, heat flux is plotted as a function of superheat temperature and is compared to prior art heat sinks reported in the literature. The trend indicates that the heat flux of the instant invention is a strong function of the surface superheat temperature, which, unlike that displayed by the majority of prior art devices that employ uniform micro channels, does not approach a plateau heat flux over the range of temperatures examined. Although not to be limited by mechanism, the performance of the heat sink somewhat resembles that of impingement cooling systems.

FIG. 3 illustrates the heat flux dependence on mass flux of the device. Again, in comparison to other state of the art heat sinks, a superior heat flux is achieved at a much lower mass flux, being more than an order of magnitude lower than that previously reported. As the system has an unprecedented 100% vapor quality, a dramatically higher heat transfer coefficient is achievable. When compared to the previous maximum vapor quality device, the heat transfer coefficient is about an order of magnitude higher for the heat sink, according to an embodiment of the invention.

FIG. 4 shows a plot of the heat sink's coefficient of performance (COP) where: COP=VΔP, where V is the volumetric flow rate and ΔP is the pressure drop. The COP is superior to state of the art heat sinks by more than an order of magnitude.

Hence, a heat sink, according to an exemplary embodiment of the invention, has been constructed from silicon with a PTFE membrane, in the manner illustrated in FIG. 1, that displays a cooling rate of 383 W/cm$^2$ and a heat transfer coefficient of 264 kW/m$^2$K with an exit vapor quality of 100% at a mass flux of 28.4 kg/m$^2$s and a surface superheat temperature of 23.4° C. This compares favorably with the state of the art cooling rate of 370 W/cm$^2$ that requires a surface superheat temperature of 98.4° C., or displays a lesser, but still relatively high, heat flux of 283 W/cm$^2$ and heat transfer coefficient of 218 kW/m$^2$K, but requires a high mass flux of 372 kg/m$^2$s with a vapor exit quality of about 10%, Kalani and Kandlikar (2013). The exemplary heat sink, according to an embodiment of the invention, displays an unprecedented coefficient of performance (COP) that is an order of magnitude higher than any prior heat sink for microelectronic devices.

In an embodiment of the invention, thin film evaporation over a predefined liquid-vapor interface as the main mode of heat transfer by employing liquid and vapor microchannels that are separated with arrays of equi-spaced posts, which act as capillary forced valves and limit mixing of liquid and vapor phases, is shown in FIG. 6. As shown in FIG. 6, the meniscus plane is normal to the heated surface and the total evaporation surface depends on the height of the micro-posts.

FIG. 7 shows a schematic of a unit cell of the embedded evaporative heat sink formed at the capillary forced valves formed between the micro-posts. In an exemplary embodiment, the heat sink device is fabricated on a silicon wafer, with dimensions given in Table 1, below, where these dimensions are selected to be within the capabilities and limits that exist in standard state of the art micro-fabrication methods, such as Deep Reactive Ion Etching (DRIE).

TABLE 1

| Geometrical Dimensions of micro-fabricated device | |
|---|---|
| Channel Height, H (μm) | 150 |
| Liquid Channel Width, S1 (μm) | 30 |
| Fin Width, S2 (μm) | 30 |
| Vapor Channel Width, S3 (μm) | 30 |
| Gap Width, 2 × W1 (μm) | 15 |
| Center to Center Pillar Spacing, 2 × W2 (μm) | 35 |

Thermohydraulic characteristics of the proposed heat sink are computed by a set of numerical simulations performed for the unit cell domain shown in FIG. 7 for different working conditions. The computational domain is discretized by structured hexahedron meshes, as illustrated in FIG. 8. In simulations, liquid and vapor phases are separated by an interface (ABCDEA plane in FIG. 8) across which the phase-change occurs. The interface temperature is fixed at the equilibrium saturation temperature corresponding to the system pressure. The boiling mass transfer rate at the liquid-vapor interface is equal to the jump condition on the thermal flux divided by the latent heat of vaporization:

$$\dot{m}_{evap} = \left(\frac{-k_{liq}\nabla T \cdot \vec{n} + k_{vap}\nabla T \cdot \vec{n}}{h_{fg}}\right)\frac{A_{interface}}{\forall_{cell}}, \quad [1]$$

where n is interface normal vector, $A_{interface}$ is area of interface located within the computational cell and $\forall_{cell}$ is the cell volume, as indicated in FIG. 8. To accurately estimate the spatial gradients at the interface, a Level-Set method is used, which is an interface tracking scheme with a smooth and continuous nature. In Level-Set method, the interface motion is captured by a convection equation for a Level-Set Function, ϕ, which zero level set separates the vapor phase (ϕ>0) from the liquid phase (ϕ<0):

$$\frac{\partial \phi}{\partial t} + \vec{v} \cdot \nabla \phi = 0. \quad [2]$$

The level-set method is utilized only to compute the spatial gradients in calculations of evaporation rate and surface tension forces at the interface. To track the liquid and vapor volume fractions in each cell over the entire computational domain, a volume-conserved technique, a Volume of Fluid (VOF) method, has been employed. In this method, a convection equation is used to calculate the liquid volume fraction, αl, as:

$$\frac{\partial}{\partial t}(\alpha_l \rho_l) + \vec{v} \cdot \nabla(\alpha_l \rho_l) = \dot{m}_{evap}. \quad [3]$$

Volume conservation in each cell dictates the vapor volume fraction to be as $\alpha_v=1-\alpha_l$. Since, the volume fraction values do not uniquely identify the interface between the phases, an interface reconstructing scheme is inevoked. A piecewise linear geometric reconstruction scheme available in FLUENT, (User's Guide for ANSYS FLUENT 12, Fluent Inc., 2009) is employed to update the volume fraction values in each cell through a reconstruction step followed by a propagation step. In the reconstruction step, the orientation of the segment that divides each into the vapor and liquid parts is calculated. In the propagation step, the flux of volume of a particular fluid through a mixture cell face during a time step is computed and the volume of fraction field at the new time is updated. In the exemplary heat sink device using a length scales of 10-150 μm, the effect of gravitational forces is found to be negligible with respect to surface tension forces Bond number, Bo=ρgL2/σ~10-5-10-3) and is not taken into account in the numerical simulation. Surface tension forces are considered using a continuum surface force (CSF) model.

The surface tension force can be converted into a volumetric force using the divergence theorem:

$$F_{vol} = \frac{2\sigma\rho\kappa\nabla\alpha_l}{(\rho_l + \rho_v)} \quad [4]$$

where σ is the surface tension, ρ is the volume-fraction-averaged density ($\rho=\alpha_v\rho_v+\alpha_l\rho_l$) in the computational cell and κ is the interface curvature calculated as the divergence of the normal vector as:

$$\kappa = \nabla \cdot \frac{\nabla\alpha_l}{|\nabla\alpha_l|}. \quad [5]$$

This volumetric force then becomes a source for the momentum equation as follows:

$$\frac{\partial}{\partial t}(\rho\vec{v}) = \nabla \cdot (\rho\vec{v}\vec{v}) = -\nabla p + \nabla \cdot [\mu(\nabla \vec{v})] + F_{vol} \quad [6]$$

The finite-volume based solver, FLUENT, is employed to solve the present multiphase microscale problem. The evaporation model is implemented via a User-Defined Function (UDF), written in C code and is capable of parallel computing. In the UDF, first, computational cells located at the interface are detected. The interfacial computational cell has at least one node with a different sign for the level set function compared to the other nodes. Then, the interface plane (ABCDA plane in FIG. 8) and its normal direction ($\vec{n}$) are determined. Subsequently, temperature gradient component normal to the interface ($\nabla T \cdot \vec{n}$) and area of the interface within the cells are calculated. Finally, the boiling mass transfer rate of the interface cells (eq. [1]) is computed. The accuracy of the UDF is evaluated by the experimental results, below.

Boundary conditions used in the simulations are provided in FIG. 7. Liquid enters the device at a constant temperature and pressure. The fluid temperature at the topside of the field is at saturation temperature, while the top surface of the solid is assumed to be a free convection wall. Symmetric and adiabatic boundary conditions are shown in the FIG. 7. Vapor exits the device at a constant pressure. The flow field is discretized by a uniform computational grid. The grid dimensions of the computational domain were 0.2 μm in all three directions. A grid independence study ensured that the computational results are independent of the grid size. The maximum error in the calculations of local wall heat flux and evaporative mass flux were found to be less than 3% when the grid size was reduced by a factor of 2. Simulations were performed using UF NESL Sandy-Bridge cluster, which is a high performance server having computing nodes of hexa core Intel Xeon ES-2620 processors at 2 GHz and 32 GiB of RAM, where all simulations were run with 96 parallel cores.

FIG. 9A shows SEM micrographs of the micro-fabricated heat sink. There are two types of microchannels inside the heat sink, as indicated in FIG. 9B: channels with an open inlet port (liquid channels) and channels with blocked inlets (vapor channels). As the working liquid flows into the liquid microchannels, the capillary force acting between two consecutive posts forms a meniscus between the pillars, which stops the liquid from entering into the vapor channel. Geometrical dimensions of the exemplary micro-fabricated device are presented in Table 1.

Device performance was tested in a custom made vacuum chamber in which the pressure and temperature can be controlled, as shown schematically in FIG. 10. The selected cooling liquid, distilled water, is delivered to the heat sink through a piezoelectric micropump (Model MP6, manufactured by Bartels Mikrotechnik GmbH), with two Vacuum Setra pressure transducers (Setra 730) for monitoring the pressures inside the chamber and the heat sink. An Agilent data acquisition system was used for recording the pressure and temperature data of the chamber and the device. The water vapor generated during the device operation was condensed by a thermo electric cooler (TEC) and returns back to the water reservoir.

To accurately measure the surface heat flux, the heat transfer loss of the device was measured as a function of its surface temperature. The heat was dissipated to the ambient and to the wiring system that connects the device heaters and sensors to a set of terminals. A measurement was conducted while the heat sink was dry and the energy supplied to the device to maintain it at a set temperature is considered to be its heat loss.

Hydraulic Characteristics:

Under steady state condition, liquid flows in the main channels and forms a meniscus between the gaps of the two adjacent microposts, in the manner illustrated in FIG. 6. The liquid-vapor interface is characterized by surface tension and pressure of supplied liquid. Namely, at equilibrium, the hydrostatic pressure acting on the meniscus should equal friction and capillary forces. At the interface, the Young-Laplace equation:

$$\Delta P = P_l - P_v = \frac{2\sigma_f \cos\theta_A}{R}, \quad [7]$$

where $\sigma_f$ is surface tension of water, $\theta_A$ is the advancing contact angle, R is the radius of curvature and $P_l$ and $P_v$ denote liquid and vapor pressure, respectively.

In order to study the flow characteristics in the heat sink, a set of visualization experiments were conducted. A transparent MEMS device with similar microstructure was fabricated in Polydimethylsiloxane (PDMS), using soft-lithography techniques and was then covered with a thin PDMS membrane. Tests were conducted at different liquid pressures to investigate their effect on the shape and position of the meniscus. Images were captured from the top-side of the device and at the middle height of the microchannel (z=75 μm). At low pressure, the interface curvature is almost zero and surface friction force acting on the interface balances the pressure of the liquid and prevents liquid from flowing into the gap. Increasing the pressure, as illustrated in the FIG. 11A, increases the curvature of meniscus and expands the contact area between liquid and side walls of the post. The meniscus, which is still pinned to the top and bottom walls, starts to curve and move forward to compensate for the increased pressure. Further increase in the pressure will result in the complete progress of the meniscus until it is pinned at the end of the gap, as illustrated in FIG. 11A. The same trend in the advancement of the meniscus by increasing the liquid pressure is also captured in the simulation results and illustrated in FIG. 11B. However, slight differences in the shape and the position of the interface are can occur and to visualize these differences, as in FIG. 11A, a constant contact angle measured by the static sessile drop method is assumed and the sidewall scallop pattern formed in Deep Reactive Ion Etching (DRIE) process affects the surface flatness of the micropillars, which differs from perfectly flat side walls that are assumed for the numerical simulations. When the pressure reaches a critical value (burst pressure), increasing the curvature (i.e., reducing the radius of curvature) is insufficient to cancel the excess pressure force and the meniscus breaks to allow the liquid to flow into the vapor channel. Use above the critical pressure is undesirable since it eliminates the liquid-vapor interface and therefore is detrimental to the performance of the heat sink device.

FIGS. 12A and 12B show the steady state temperature field of the liquid and vapor phase as well as the particle path in the unit cell at low pressure. Liquid heats as it comes close to the fins and evaporates at the interface. As can be seen from particle path in FIG. 12A, higher evaporation rates occurs in the vicinity of the wall, where a significant temperature gradient exists between the wall and interface. Non-uniform evaporation rate over the interface causes the liquid to have high velocity near the wall and low velocity in the middle and therefore imposes vortices in the flow pattern near the interface. The particle path for a 3D meniscus is shown in FIG. 12B, which illustrates that vortices occur over the entire meniscus to ensure delivery of liquid to the high evaporation regions.

With the increase in the liquid pressure, the cooling liquid will flow further inside the gap and bring more liquid in contact with the side walls of the posts. Modeling assumes that the flow conditions are similar to flow between two walls with constant temperature. The small hydraulic diameter of the gap corresponds to significant heat transfer rate between the wall and liquid and therefore liquid temperature can rise quickly, as suggested in FIG. 13A. The variation of wall heat flux on the side wall of fins is illustrated in FIG. 13B. Three distinct regions can be identified as the liquid comes in contact with the fins: Region (A-B) where micro-convective heat transfer dictates the mechanism of heat transfer between the solid and liquid phases, where the heat transfer rate is significant at the entrance, an entry length effect, and decreases as the liquid advances through the gap; Region (B-C) in the vicinity of the interface, where conduction is the major mode of heat transfer to remove heat from the fins with conduction heat transfer increasing as the distance between the wall and meniscus reduces and reaches a maximum at the interface at point C; and Region (C-D) in the vapor phase domain where heat transfer is significantly lower compared to the liquid phase because of lower thermal conductivity and density of water vapor.

FIG. 14A shows the variation of the heat flux over the side wall of the fins at different pressures. At low pressure, wall heat flux starts from a maximum value very close to the inlet of the gap and decreases rapidly. This results because, at low pressure, the meniscus is formed very close to the gap entrance and, therefore, regions A-B and B-C will overlap and result in relatively high wall heat flux at the inlet, which quickly reduces as vapor comes in contact with the wall. Increasing the pressure brings the liquid further inside the gap and the aforementioned regions can clearly be identified. Further incursion into the gap will increase the temperature of liquid and results in higher conduction heat transfer from wall to interface.

Local evaporative mass flux over the liquid-vapor interface at different supplied liquid pressure is depicted in FIG. 14B. High evaporative mass flux in the vicinity of the micro-pillars declines at the center of interface where a lower temperature gradient exists. As the supplied liquid pressure increases, the gradient of the mass flux drops. The reason for this relationship is apparent from FIG. 13A in which a more uniform temperature field within the micro-pillars is obtained at higher liquid pressure. So as the supplied liquid pressure increases, the uniformity of evaporative mass flux over the entire interface increases. The average evaporative mass flux increases with pressure due to an intensified heat transfer characteristics of the liquid encapsulated between the micro-pillars at elevated supplied pressure. Evaporative mass flux, as plotted in FIG. 14B, demonstrates that the heat sink is not limited by constraints that are common to other evaporative cooling systems, where most of all evaporation occurs from a small area, which decreases overall thermal performance. The heat sink devices according to embodiments of the invention show higher and more uniform evaporation rates over the entire liquid-vapor interface.

Experimentally observed effects of the supplied inlet pressure on the thermal performance of the heat sink device of FIG. 9A, as a function of superheat temperature, is shown in FIG. 15A. Increasing the liquid pressure intensifies the liquid temperature gradient at the meniscus, which leads to an increase in the heat flux dissipated by the device at a constant wall superheat temperature as can be seen in FIG. 15A. FIG. 15A provides heat flux data of the numerical simulation with experimental results, showing agreement within 17%. The difference between the numerical and experimental results is consistent with: a non-uniform pressure distribution within the device that varies from micro-pillar to micro-pillar because of a pressure drop inside the liquid channels as opposed to the constant liquid pressure used in the computations; assumption of sidewall flatness of the micro-pillars in simulations as opposed to a scallop patterned wall formed by the Deep Reactive Ion Etching (DRIE) process during fabrication; assumption of a constant contact angle in simulation rather than a contact angle that is dynamically varying between advancing and receding angles; and the slight variation in the experimental local surface temperature of the heat sink observed in experiments but estimated by a constant averaged-temperature in the numerical simulations.

FIG. 15B shows heat transfer coefficients versus the surface temperature at different liquid inlet pressures. The heat transfer coefficient increases with increasing liquid pressure and decreases as the surface temperature rises. As boiling starts inside the device, the stable liquid-vapor interface breaks and the heat transfer coefficient drops as indicated in FIG. 15B.

Experimental results presented in FIGS. 15A and 15B illustrate that increasing the liquid pressure delays the onset of nucleation boiling temperature in the heat sink. To explain this behavior, a set of numerical simulations were conducted based on the experimental conditions to explore the region that has the highest probability for triggering the bubble nucleation process, a region with highest temperature and the lowest heat transfer coefficient. The simulations suggest that the region of highest probability of bubble nucleation is located farthest from the interface and close to the center line of the liquid channel. FIG. 16 illustrates the liquid temperature contours of a vertical plane intersecting the center line of the liquid channel at two different inlet liquid pressures. As shown in FIG. 16, increasing the liquid pressure results in a lower bulk temperature, which suppresses bubble nucleation in the main channel.

As shown in FIG. 17 the geometry of the profile of the vapor microchannels can be modified to increase the membrane area relative to the area of the heat sink surface. The heat sink can be any heat conductor, for example, but not limited to, a metal or metal alloy, for example, but not limited to, copper, stainless steel, or brass. A spacer can define the walls from the heat sink to the supported membrane, and the shape defined by the spacer defines the area ratio of the membrane and the heat sink. The spacer can be of any material, and can be a good thermal conductor, such as a metal, or can be a thermal insulator, for example, but not limited to, a rubber or plastic, for example, but not limited to, silicone or other resin. The membrane can be a hydrophobic or hydrophilic membrane, although hydrophilic membranes can give very high performances, pore sizes can vary as long as the membrane resists liquid flow through the membrane. The combination of the pore size and membrane material relationship defines the permeability, for example, the permeability of water is indicated below in Table 2, where the highest permeability is for the large pore size hydrophilic membrane, Versapor®.

TABLE 2

Membranes Employed in the Heat Sinks for the Data Illustrated in FIGS. 17-27

| Membrane | Material | Pore size (μm) | Permeability (1/hr/cm²/kPa) |
|---|---|---|---|
| #1 | Polyethersulfone (PES) | 8.0 | 0.2 |
| #2 | Polytetrafluoroethylene (PTFE) | 5 | 5 |
| #3 | acrylic copolymer (Versapor ®) | 10 | 20 |

In addition to the nature of the materials and the relative area of the membrane and heat sink, the microstructure of the vapor microchannels defines the performance of the heat sinks, according to embodiments of the invention. Different microstructures are summarized in Table 3, below.

TABLE 3

Microstructure Parameters for the Heat Sinks for the Data Illustrated in FIGS. 17-27

| Device | Spacing, s (μm) | Fin Side, d (μm) | Fin Height, h (μm) | Wickability (cm/s) | Surface Roughness, r |
|---|---|---|---|---|---|
| #1 | 75 | 50 | 50 | 0.06 | 1.64 |
| #2 | 200 | 100 | 150 | 0.18 | 1.67 |
| #3 | 300 | 50 | 325 | 0.31 | 1.56 |
| #4 | 200 | 150 | 500 | 0.30 | 3.45 |

As can be seen in Table 3 and FIGS. 17-27, structures that promote good wickability and surface roughness give excellent results. A record cooling capacity of 1700 W/cm² has been achieved as illustrated in FIGS. 26 and 27.

All publications referred to or cited herein are incorporated by reference in their entirety, including all FIG.s and tables, to the extent they are not inconsistent with the explicit teachings of this specification. It should be understood that the examples and embodiments described herein are for illustrative purposes only and that various modifications or changes in light thereof will be suggested to persons skilled in the art and are to be included within the spirit and purview of this application.

We claim:

1. A phase change heat sink, comprising:
a reservoir defined by a first surface spaced a distance from a second surface, the reservoir being accessible through a liquid fluid inlet, at least one of the first surface and the second surface comprising a vapor fluid outlet at least partially defined by a membrane; and
an active area comprising a textured surface and configured to be in fluidic contact with fluids, the active area being accessible through said liquid fluid inlet,
wherein:
the active area is configured to cause, in response to a liquid fluid being communicated through the liquid fluid inlet and into the reservoir the liquid fluid to be fully vaporized into a vapor fluid in response to absorbing heat; and
the membrane is configured to communicate said vapor fluid, formed from the liquid fluid once vaporized, out of the phase change heat sink, said membrane being permeable to said vapor fluid and impermeable to said liquid fluid.

2. The phase change heat sink of claim 1, wherein the textured surface comprises a plurality of solid features formed by removing material from a portion of a substrate.

3. The phase change heat sink of claim 1, wherein the textured surface comprises a plurality of solid features integrally formed with a substrate.

4. The phase change heat sink of claim 1, wherein the textured surface comprises a plurality of solid features disposed onto a substrate and extending from said substrate.

5. The phase change heat sink of claim 4, wherein said reservoir comprises a liquid microchannel for said liquid fluid, wherein said plurality of solid features comprise an array of posts, and wherein said active area includes a vapor microchannel separated from said liquid microchannel by at least a portion of the array of posts.

6. The phase change heat sink of claim 1, wherein said liquid fluid comprises water.

7. The phase change heat sink of claim 1, wherein said liquid fluid comprises: a fluorocarbon or a hydrofluorocarbon.

8. The phase change heat sink of claim 1, wherein said plurality of solid features have cross-sections of 1 to 200 micrometers.

9. The phase change heat sink of claim 1, wherein said membrane is a hydrophobic membrane.

10. The phase change heat sink of claim 1, wherein said membrane is nanoporous or microporous.

11. The phase change heat sink of claim 1, wherein a surface area of the active area, or said distance between the first and the second surfaces, is sufficient to cause the formation of bubbles within said liquid fluid.

12. The phase change heat sink of claim 1, wherein said first surface comprises said active area and said second surface comprises said membrane.

13. A method to cool a microelectronic device, comprising:
    contacting a heat transmitting device to a phase change heat sink;
    providing a liquid fluid through a liquid fluid inlet of the phase change heat sink;
    absorbing, by said liquid fluid, heat transmitted from the heat transmitting device, thereby vaporizing all of said liquid fluid to form a vapor fluid;
    passing said vapor fluid through a membrane of said phase change heat sink;
    condensing said vapor fluid at a condenser to reform said liquid fluid; and
    re-providing said liquid fluid to said liquid fluid inlet of said phase change heat sink.

14. The method of claim 13, wherein said vaporizing all of said liquid fluid to said vapor fluid occurs between a liquid microchannel for said liquid fluid and a vapor microchannel.

15. A phase change heat sink, comprising:
    a fluid reservoir defined by a first surface positioned a distance from a second surface, the fluid reservoir being accessible by a liquid fluid through a liquid inlet of the phase change heat sink, the first surface comprising an active area having a surface area greater than a surface area of portions of the first surface other than the active area, wherein the active area is configured to be in fluidic contact with fluids, the second surface comprising a membrane that is permeable to a vapor fluid and impermeable to said liquid fluid,
    wherein the active area comprises one of a texture or a plurality solid features extending from said first surface, the active area being configured such that the liquid fluid vaporizes entirely into the vapor fluid in response to the liquid fluid absorbing heat.

16. The phase change heat sink of claim 15, wherein said fluid reservoir comprises a liquid microchannel for said liquid fluid and said active area comprises an array of posts extending from a substrate, and wherein said active area includes a vapor microchannel separated from said liquid microchannel by said array of posts.

17. The phase change heat sink of claim 15, wherein said liquid fluid comprises at least one of: water, an alcohol, a fluorocarbon, or a hydrofluorocarbon.

18. The phase change heat sink of claim 15, wherein said membrane is a hydrophobic membrane.

19. The phase change heat sink of claim 15, wherein said surface area of said active area is sufficient to cause formation of bubbles within said liquid fluid.

20. The phase change heat sink of claim 15, wherein said distance between said first surface and said second surface is sufficient to cause formation of bubbles within said liquid fluid.

* * * * *